(12) United States Patent
Harada et al.

(10) Patent No.: US 8,597,479 B2
(45) Date of Patent: Dec. 3, 2013

(54) SPUTTERING SYSTEM

(75) Inventors: Keitaro Harada, Yamagata (JP);
Masayoshi Yokoo, Yamagata (JP);
Norikazu Kainuma, Yamagata (JP);
Yoshinobu Takano, Yamagata (JP); Isao Tanikawa, Kanagawa (JP)

(73) Assignee: Tohoku Seiki Industries, Ltd., Yamagata (JP)

( * ) Notice: Subject to any disclaimer, the term of this patent is extended or adjusted under 35 U.S.C. 154(b) by 931 days.

(21) Appl. No.: 11/815,519

(22) PCT Filed: Feb. 8, 2005

(86) PCT No.: PCT/JP2005/001830
§ 371 (c)(1),
(2), (4) Date: Sep. 15, 2008

(87) PCT Pub. No.: WO2006/085354
PCT Pub. Date: Aug. 17, 2006

(65) Prior Publication Data
US 2009/0026073 A1    Jan. 29, 2009

(51) Int. Cl.
C23C 14/00 (2006.01)
C23C 14/32 (2006.01)
C25B 9/00 (2006.01)
C25B 11/00 (2006.01)
C25B 13/00 (2006.01)

(52) U.S. Cl.
USPC ............ 204/298.22; 204/192.12; 204/298.16; 204/298.17; 204/298.2

(58) Field of Classification Search
USPC ............... 204/192.12, 298.2, 298.16, 298.17, 204/298.22
See application file for complete search history.

(56) References Cited

U.S. PATENT DOCUMENTS

| | | | | |
|---|---|---|---|---|
| 4,714,536 | A * | 12/1987 | Freeman et al. | 204/298.2 |
| 5,374,343 | A * | 12/1994 | Sasaki et al. | 204/298.2 |
| 5,556,519 | A * | 9/1996 | Teer | 204/192.12 |
| 6,228,235 | B1 * | 5/2001 | Tepman et al. | 204/298.2 |
| 6,258,217 | B1 * | 7/2001 | Richards et al. | 204/192.12 |
| 6,864,773 | B2 * | 3/2005 | Perrin | 335/306 |
| 7,686,928 | B2 * | 3/2010 | Gung | 204/298.2 |
| 7,718,042 | B2 * | 5/2010 | Kadlec et al. | 204/192.12 |

FOREIGN PATENT DOCUMENTS

| JP | 03138360 A | * | 6/1991 |
|---|---|---|---|
| JP | 3-257163 | | 11/1991 |
| JP | 03285067 A | * | 12/1991 |
| JP | 05001373 A | * | 1/1993 |
| JP | 7-292468 | | 11/1995 |
| JP | 2505724 | | 4/1996 |
| JP | 2002-254294 | | 9/2002 |
| JP | 2003-147522 | | 5/2003 |
| JP | 2004091845 A | * | 3/2004 |

* cited by examiner

*Primary Examiner* — Michael Band
(74) *Attorney, Agent, or Firm* — Mattingly & Malur, PC

(57) ABSTRACT

A magnetron sputtering system generates a high density plasma on a target by applying magnetic fields intersecting an electric field by using a plurality of magnets that are rotatably supported. The respective magnets are revolved and rotated so that the time variation of regions where a magnetic field (line of magnetic force) generated by the each magnet is orthogonal to an electric field is prevented from becoming monotonous. Further, the respective magnets are arranged to make the distances between the center of rotation and the center of revolution of the respective magnets different from each other, so that the regions where the magnetic field (line of magnetic force) generated by the each magnet is orthogonal to the electric field are dispersed in the radial direction of a target.

2 Claims, 21 Drawing Sheets

In case of (Rotation Angle/Revolution Angle)=2

In case of (Rotation Angle/Revolution Angle)=1.7

In case of (Rotation Angle/Revolution Angle)=3. 1

In case of (Rotation Angle/Revolution Angle)=3. 1
and layered three MC's profile in Fig.1

In case of (Rotation Angle/Revolution Angle)=3. 1
and layered three MC's profile in Fig.11

SPUTTERING SYSTEM

TECHNICAL FIELD

The present invention relates to a sputtering system, and more particularly, to an effective technique when applied to a magnetron sputtering system which generates a high density plasma on a target by applying magnetic fields intersecting an electric field by using magnets.

BACKGROUND ART

Conventionally, there is a method referred to as sputtering, as a method for forming a thin film on the surface of a silicon substrate, a resin substrate, a ceramic substrate, or the like.

In the sputtering, for example, in a state where a target made of a predetermined material is arranged to face the substrate in a vacuum container, a discharge gas is introduced into the vacuum container, and a plasma is generated by applying an electric field between the substrate and the target. Thereby, atoms or molecules are discharged from the target by making positive ions of the plasma collide with the target. Then, the thin film is formed by making the discharged atoms introduced and deposited onto the surface of the substrate.

Conventionally, electrode structures of various systems have been proposed for the system which forms a thin film by the sputtering (hereinafter referred to as sputtering system). Among the electrode structures, an electrode structure of a magnetron system has been industrially most frequently used. The sputtering system to which the magnetron system is applied, is capable of generating a high density plasma on the target in such a manner that electrons discharged from the cathode are made to perform a trochoid movement by applying a magnetic field intersecting the electric field. This makes it possible to enhance the sputtering rate by a relatively low voltage and to increase the forming rate of the thin film.

Conventionally, there are various types of the electrode structure of the magnetron system, but the type which is industrially most useful and common is, for example, an electrode structure referred to as a planar magnetron cathode electrode provided with a target having a planar shape, as shown in FIG. 22 and FIG. 23. In the planar magnetron cathode electrode, for example, as shown in FIG. 23, an S pole 102 of a magnet is provided near the center of the back surface side of the target 8, that is, the back surface side of the surface facing the substrate 6, and an N pole 101 of the magnet is provided in the outer peripheral part of the target 8. At this time, the magnetic field as shown in FIG. 22 is generated on the target 8, which causes an electron to perform the trochoid movement.

At this time, the trochoid movement of electron is caused in the vicinity where the magnetic field (line of magnetic force) is orthogonal to the electric field E, as shown in FIG. 24. Thereby, as shown in FIG. 25, in the region MC where the magnetic field (line of magnetic force) is orthogonal to the electric field, more atoms or molecules are discharged so that the consumption rate of the target 8 is increased as compared with the other parts. Further, at this time, in the region MC where the magnetic field (line of magnetic force) is orthogonal to the electric field E, more atoms or molecules are discharged, and hence in a film 8' formed on the surface of the substrate 6, as shown in FIG. 25, a variation arises between the film thickness of the part facing the region MC where the magnetic field (line of magnetic force) is orthogonal to the electric field E, and the film thickness of the other parts.

Further, in recent years, for example, there are proposed a method which reduces the variation of film thickness by temporally changing the region where the magnetic field (line of magnetic force) is orthogonal to the electric field, by rotating the magnet (see, for example, Patent Document 1), and a method in which the magnet is formed into a complicated shape so that the region where the magnetic field (line of magnetic force) is orthogonal to the electric field is made uniform (see, for example, Patent Document 2).

Patent Document 1: Japanese Patent Laid-Open No. 7-292468

Patent Document 2: Japanese Patent No. 2505724

A problem to be solved by the present invention is, as explained in the background art, that in the sputtering system using the planar magnetron cathode electrode, it is difficult to reduce the inhomogeneity and the film thickness nonuniformity of a thin film formed on the substrate, which are caused by the nonuniform ion collision on the target surface, and the nonuniform spatial density distribution of the plasma, that is, the difference in the amount of discharged atoms or molecules of the target between the vicinity where the magnetic field (line of magnetic force) is orthogonal to the electric field and the other regions.

Further, as methods for solving the problem, for example, there are proposed the methods as described in Patent Document 1 and Patent Document 2. However, the present inventors considers that even in these methods, for example, it is difficult to make the ion collision and the spatial density distribution of the plasma uniform between the central part and the outer peripheral part of the target. In the case of the method as described in Patent Document 1, it is possible to temporally change the region where the magnetic field (line of magnetic force) is orthogonal to the electric field by rotating the magnet system (magnet), but only one magnet system is provided, and the region where the magnetic field (line of magnetic force) at a moment is orthogonal to the electric field is generated at only one position on the target. Therefore, the present inventors considers that when the enlargement of the area of substrate and the thickness reduction of the thin film to be formed are further advanced as predicted for the future, it is difficult to reduce the inhomogeneity and the film thickness nonuniformity of the thin film formed on the substrate by the method as described in Patent Document 1.

In the case of the method as described in Patent Document 2, it is possible to increase the regions where the magnetic field (line of magnetic force) is orthogonal to the electric field, by alternately arranging annular N poles and S poles, which have different radius, but the magnetic field (line of magnetic force) is not orthogonal to the electric field on the N pole and the S pole, so that the ion collision and the spatial density distribution of the plasma on the target surface above the N pole and the S pole, are made different from those on the target surface between the N pole and the S pole. Therefore, the present inventors considers that when the enlargement of the area of substrate and the thickness reduction of the thin film to be formed are further advanced as predicted for the future, it is difficult to reduce the inhomogeneity and the film thickness nonuniformity of the thin film formed on the substrate by the method as described in Patent Document 2.

That is, it is an object of the present invention to uniformize the region where the magnetic field (line of magnetic force) is orthogonal to the electric field in the magnetron sputtering system, and to facilitate the homogenization of the thin film formed on the substrate and the uniformization of the thickness of the thin film.

Other objects and novel features of the present invention will become apparent from the following description and the accompanying drawings of the specification.

DISCLOSURE OF THE INVENTION

A sputtering system according to the present invention, which includes a substrate holder adapted to hold a substrate on which a thin film is formed, in a vacuum container whose inside is evacuated to a vacuum state, a target provided at a position facing a thin film forming surface of the substrate held by the substrate holder, electric field applying means adapted to apply an electric field between the substrate held by the substrate holder and the target, and magnetic field applying means adapted to apply a magnetic field intersecting the electric field on the target, which generates a plasma on the target by introducing a discharge gas in the vacuum container evacuated to the vacuum state, to generate atoms or molecules from the target, and which makes the generated atoms or molecules deposited on the substrate held by the substrate holder to form the thin film, is most primarily characterized in that the magnetic field applying means includes a plurality of magnet pairs adapted to independently generate a magnetic field, respectively, magnet revolving means adapted to revolve the plurality of magnet pairs, and magnet rotating means adapted to rotate the plurality of magnet pairs in linkage with the magnet revolving means, and in that the N pole and the S pole of the respective magnet pairs are arranged in a manner that a magnetic field is generated by an interaction of one of the N pole and the S pole of the each magnet pair with the other pole of the other magnet pair, and the generated magnetic field is changed during the respective magnet pairs are revolved and rotated.

In the sputtering system according to the present invention, the magnetic field generated by each of the plurality of magnet pairs (hereinafter simply referred to as magnet) is revolved about the axis of rotation (axis of revolution) of the magnet revolving means by revolving the plurality of magnet pairs. At this time, when a region where the magnetic field generated by the each magnet is orthogonal to the electric field exists, the region where the magnetic field (line of magnetic force) at a moment is orthogonal to the electric field exists at a plurality of positions on the target, which makes it possible to efficiently perform sputtering. Further, at this time, the region where the magnetic field generated by the each magnet is orthogonal to the electric field is changed in a complicated manner by revolving and rotating the respective magnets, which reduces the deviation of the region (erosion region) where many atoms or molecules are discharged. Further, in the sputtering system according to the present invention, in addition to the magnetic field independently generated by the respective magnets, a magnetic field is generated by the interaction between the adjacent magnets, and when the plurality of magnets are rotated in linkage with the revolution thereof, the magnetic field generated by the interaction between the adjacent magnets is changed. That is, according to the sputtering system of the present invention, it is possible to facilitate the uniformization the ion collision on the target surface and the uniformization of the spatial density distribution of the plasma, and to facilitate the homogenization and the film thickness uniformization of the thin film formed on the substrate.

Further, in order to rotate the respective magnets in linkage with the revolution thereof as in the sputtering system according to the present invention, it may be adapted such that the magnet rotating means is constituted by including, for example, magnet supporting means adapted to support the respective magnets in a rotatable state, an internal gear provided by being fixed along the vicinity of the outer peripheral part of the magnet supporting means, a magnet rotating gear provided by being fixed to the each magnet, and an idle gear in mesh with the internal gear and the magnet rotation gear, or with the two magnet rotation gears, and that the idle gear in mesh with the internal gear is rotated by the rotation of the magnet supporting means, and the each magnet rotation gear and the magnet are rotated in linkage with the revolution thereof.

Further, in the sputtering system according to the present invention, when a gear ratio of the internal gear and the idle gear which is in mesh with the internal gear and rotates the magnet rotation gear is set to 1:R, it is preferred that R is set to not less than 1 and not more than 5, and is not a common divisor of 360. In this manner, when the each magnet revolves one time (360 degrees), the relative positional relation (angle) between the magnets before and after the revolution is different. Thereby, the time variation of the magnetic field generated by the each magnet is made still more complicated, and the ion collision on the target surface and the spatial density distribution of the plasma are made more uniform, as a result of which the homogenization and the film thickness uniformization of the thin film formed on the substrate are facilitated.

Further, in the sputtering system according to the present invention, it is preferred that the distances from the axis of rotation of the magnet supporting means to the axes of rotation of the respective magnets are made different from each other. In this manner, when the each magnet is revolved and rotated, it is possible to make the regions where the magnetic field generated by the each magnet is orthogonal to the electric field hardly overlap with each other, and to further uniformize the ion collision on the target surface and the spatial density distribution of the plasma. Thereby, the homogenization and the film thickness uniformization of the thin film formed on the substrate are facilitated.

Figure 1:
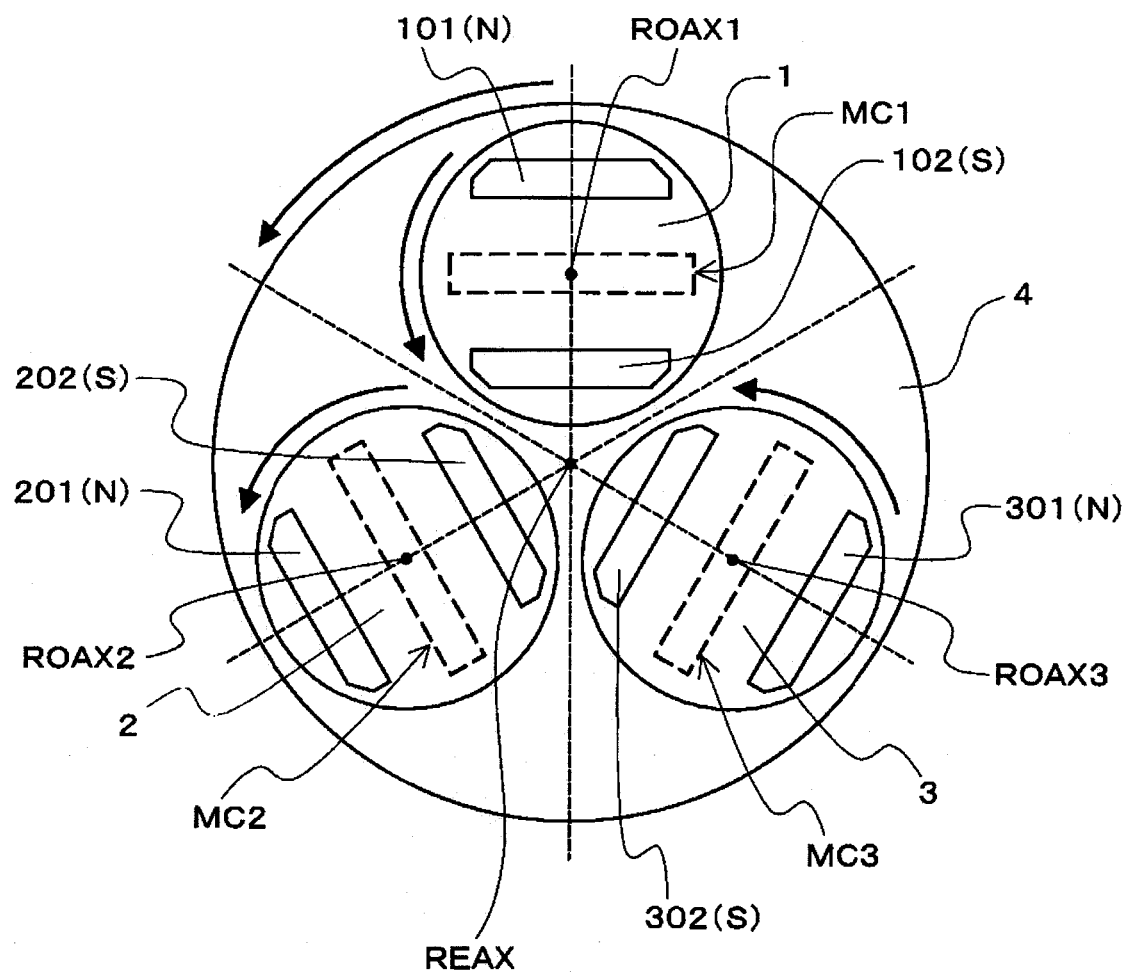
FIG. 1 is a schematic diagram for explaining a first principle of a method for applying magnetic fields in a sputtering system according to the present invention, and a plan view showing a constitution example of magnets.

11E, 11F, 11G Idle gear
MC1, MC2, MC3 Center of magnetic field of each magnet
MC Center of magnetic field generated by interaction between adjacent magnets

BEST MODE FOR CARRYING OUT THE INVENTION

In the sputtering system according to the present invention, a region where a magnetic field and an electric field on a target surface intersect perpendicularly with each other is made to change with time in a complicated manner by making a plurality of magnet pairs (hereinafter simply referred to as magnet), each of which is adapted to independently generate a magnetic field, rotated in linkage with the revolution thereof, thereby uniformizing a region (erosion region) where a number of atoms or molecules are discharged, and achieving the homogenization and the film thickness uniformization of a thin film formed on a substrate.

The present invention will be explained in more detail with reference to the accompanying drawings. Note that in all the figures for explaining embodiments according to the present invention, parts having the same function are denoted by the same reference numeral or reference character, and the repetitive explanation thereof will be omitted.

Figure 2:
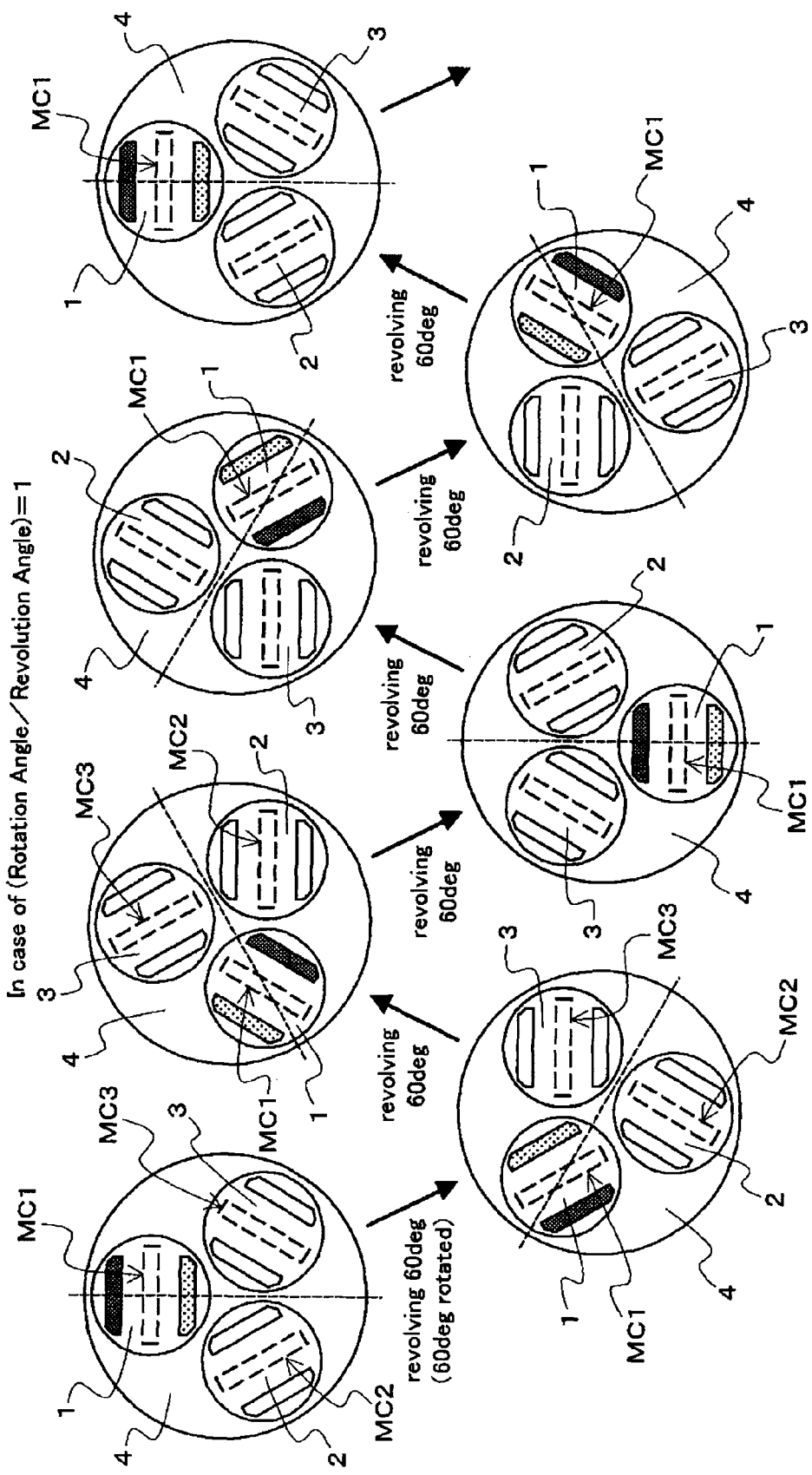
FIG. 2 is a schematic diagram for explaining the first principle of the method for applying the magnetic fields in the sputtering system according to the present invention, and a figure showing an example of operation of magnets in the case where a ratio between rotation angle and revolution angle is set to 1:1.
Figure 3:
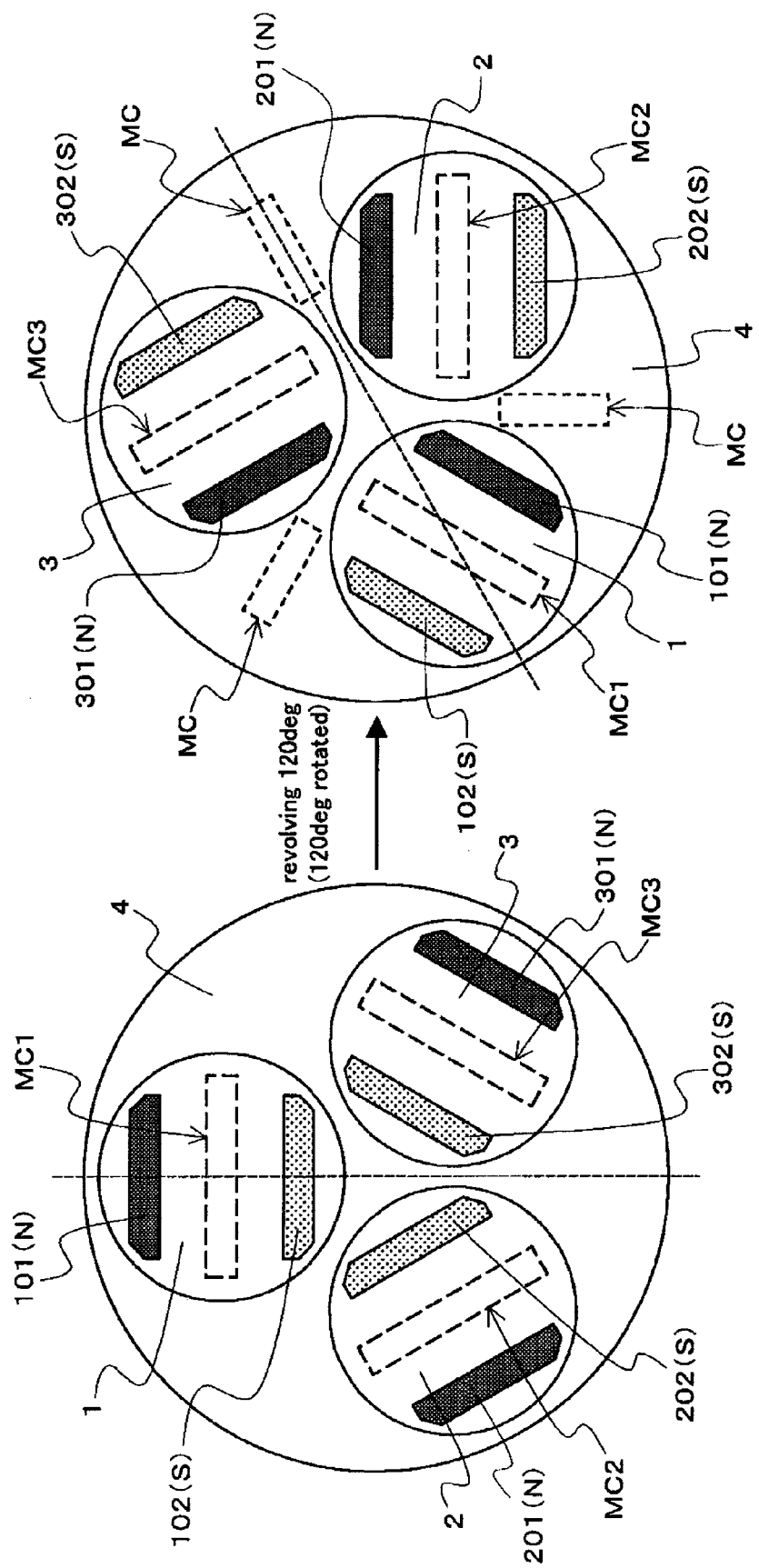
FIG. 3 is a schematic diagram for explaining the first principle of the method for applying the magnetic fields in the sputtering system according to the present invention, and a figure showing an example of operation effect.
Figure 4:
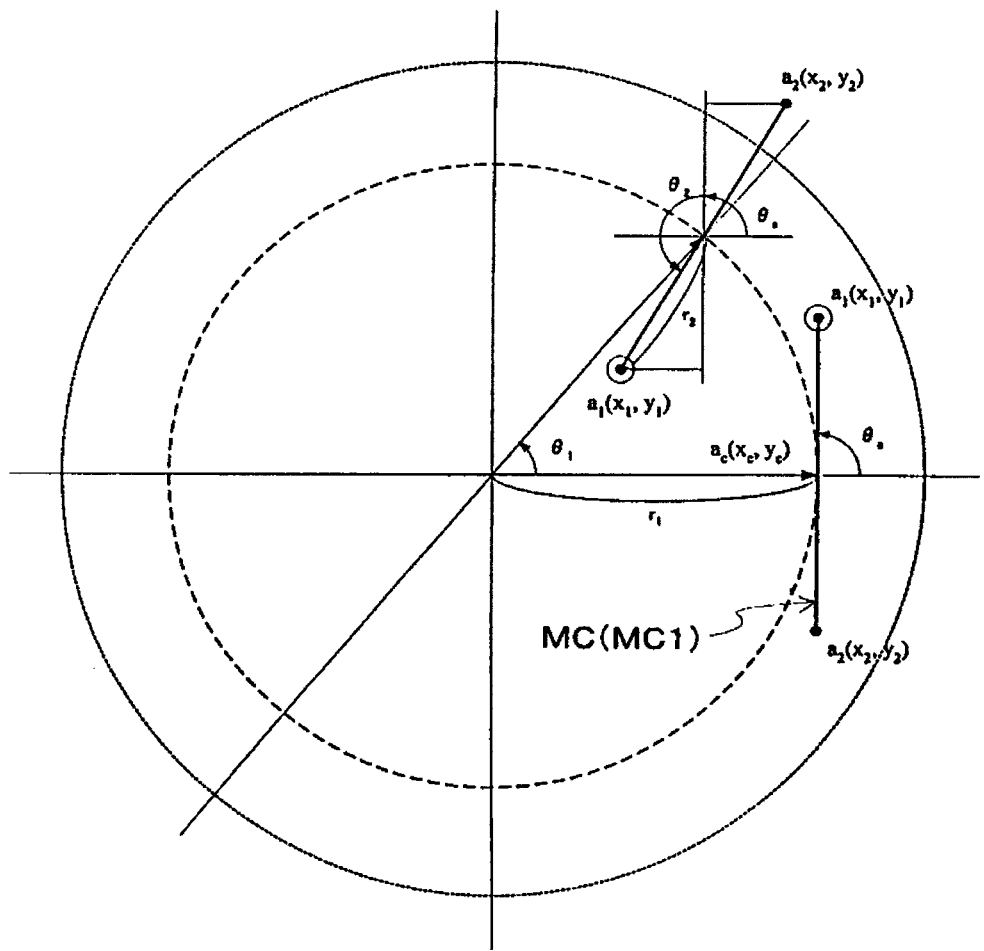
FIG. 4 is a schematic diagram for explaining the first principle of the method for applying the magnetic fields in the sputtering system according to the present invention, and a figure showing a principle of a method for obtaining a change of the center of the magnetic field.
Figure 5:
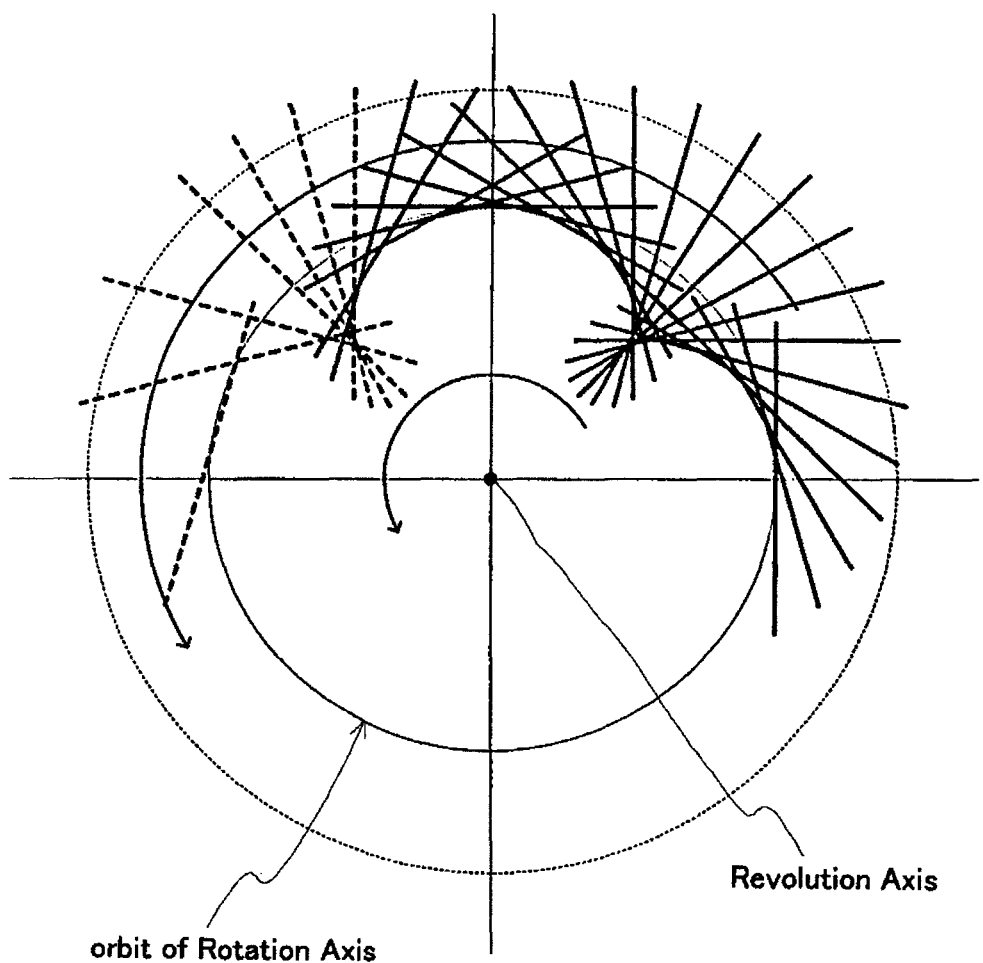
FIG. 5 is a schematic diagram for explaining the first principle of the method for applying the magnetic fields in the sputtering system according to the present invention, and a figure showing an example of the change of the center of the magnetic field in case where the ratio between rotation angle and revolution angle is set to 2:1.

FIG. 1 to FIG. 4 are schematic diagrams for explaining a first principle of a method for applying magnetic fields in a sputtering system according to the present invention. FIG. 1 is a plan view showing a constitution example of magnets. FIG. 2 is a figure showing an example of operation of the magnets in the case where a ratio between rotation speed and revolution speed is 1:1. FIG. 3 is a figure showing an example of operation effect. FIG. 4 is a figure showing a principle for obtaining a change of the center of the magnetic field. FIG. 5 is a figure showing an example of a change of the center of the magnetic field in the case where the ratio between rotation angle and revolution angle is 2:1.

In the sputtering system according to the present invention, as magnetic field applying means for applying magnetic fields which intersect an electric field applied between a target and a substrate, there is used, for example, a type in which three magnets 1, 2 and 3 are supported by magnet supporting means 4, as shown in FIG. 1. At this time, it is adapted such that the magnet supporting means 4 is rotated about an axis of rotation REAX, to enable the respective magnets 1, 2 and 3 to be revolved about the axis of rotation REAX. Further, the magnets 1, 2 and 3 are supported by the magnet supporting means 4 in a rotatable state, respectively, and are adapted to rotate about the axes of rotation ROAX1, ROAX2 and ROAX3, in correspondence with the rotation of the magnet supporting means 4, that is, the revolution of each of the magnets 1, 2 and 3, respectively.

At this time, for example, when the ratio between rotation angle and revolution angle of the respective magnets 1, 2 and 3 per unit time is 1:1, that is, when the respective magnets 1, 2 and 3 are adapted to rotate one time (360 degrees) while revolving one time (360 degrees), the respective magnets 1, 2 and 3 exhibit changes as shown in FIG. 2, while revolving one time. At this time, when the respective magnets 1, 2 and 3 have a rod shape as shown in FIG. 1 and FIG. 2, there exist the centers of magnetic field between the N pole and the S pole, that is, regions MC1, MC2 and MC3 where the line of magnetic force intersects the electric field perpendicularly. Therefore, as shown in FIG. 2, the regions MC1, MC2 and MC3 where the line of magnetic force of the respective magnets 1, 2 and 3 intersects the electric field perpendicularly, are rotated and revolved, respectively. Thereby, regions (erosion regions) on the target where atoms or molecules are liable to be discharged are uniformized, and the homogenization and the film thickness uniformization of the thin film formed on the substrate are facilitated.

Further, at this time, for example, when the respective magnets 1, 2 and 3 at a moment are in a state where the S poles 102, 202 and 302 of the respective magnets 1, 2 and 3 face each other as shown in the left-hand side of FIG. 3, the respective magnets 1, 2 and 3 are brought into a state as shown in the right-hand side of FIG. 3 by being revolved by 120 degrees. At this time, there naturally exist the centers of the magnetic field between the N pole and the S pole of the respective magnets 1, 2 and 3, that is, regions MC1, MC2 and MC3 where the line of magnetic force intersects the electric field perpendicularly. In addition, a magnetic field is generated due to the interaction between the N pole and the S pole of the adjacent magnets, for example, between the N pole 101 of the magnet 1 and the S pole 202 of the magnet 2, so as to form a region MC where the line of magnetic force intersects the electric field perpendicularly. That is, by revolving and rotating the plurality of magnets, the magnetic field MC between the adjacent magnets is repeatedly generated and extinguished, in addition to the magnetic fields independently generated by the respective magnets, so that the region (erosion region) on the surface of the target where atoms or molecules are liable to be discharged, is changed in a more complicated manner. As a result, it is possible to uniformize the erosion region on the whole and to facilitate the homogenization of the thin film formed on the substrate and the uniformization of the thickness of the thin film.

Further, in FIG. 2, the time variation of the magnets is explained by exemplifying the case where the ratio between rotation angle and revolution angle per unit time of the respective magnets 1, 2 and 3 is 1:1, that is, the case where the respective magnets rotate one time while revolting one time, but it is possible to make the time variation of the erosion region more complicated by increasing the ratio between rotation angle and revolution angle per unit time, and to further uniformize the erosion region on the whole.

For one of the magnets shown in FIG. 1, the time variation of the region (erosion region) where the magnetic field and the electric field perpendicularly intersect each other is derived from, for example, a relational formula as shown in FIG. 4. That is, in the case where, when a magnet is in a position before starting the revolution, the coordinates of the rotation center $a_c$ of rotation and the coordinates of one end $a_1$ and the other end $a_2$ of the magnetic field are set as $(x_c, y_c)$, $(x_1, y_1)$ and $(x_2, y_2)$, respectively, and where the ratio between rotation angle and revolution angle per unit time is set to N, the coordinates of the rotation center $a_c$ of rotation of the magnet become $(r_c \cos \theta_1, r_c \sin \theta_1)$, when the magnet is revolved by a revolution angle $\theta_1$. Further, since the magnet is rotated by the rotation angle $\theta_2 = (1+N)\theta_1$ at this time, when the coordinates of the one end $a_1$ and the other end $a_2$ of the magnetic field after the magnet is revolved by the revolution angle of $\theta_1$ are set as $(x_1', y_1')$ and $(x_2', y_2')$, respectively, the coordinates of $x_1'$, $y_1'$, $x_2'$ and $y_2'$ can be obtained by the following formulas (Formulas 1-1 to 1-4), respectively.

$$x_1' = r_2 \cos\{(1+N)\theta_1 + \theta_a\} + r_1 \cos \theta_1 \quad \text{(Formula 1-1)}$$

$$y_1' = r_2 \sin\{(1+N)\theta_1 + \theta_a\} + r_1 \sin \theta_1 \quad \text{(Formula 1-2)}$$

$$x_2' = r_2 \cos\{(1+N)\theta_1 - \theta_a\} + r_1 \cos \theta_1 \quad \text{(Formula 1-3)}$$

$$y_2' = r_2 \sin\{(1+N)\theta_1 + \theta_a\} + r_1 \sin \theta_1 \quad \text{(Formula 1-4)}$$

Note that $\theta_a$ in Formulas 1-1 to 1-4 is an initial angle.

From the relation as shown in FIG. 4 and Formulas 1-1 to 1-4, for example, a path of the center (erosion region) of the magnetic field of one magnet in the case where the ratio between rotation angle and revolution angle per unit time is set to 2:1 (N=2) is obtained as shown in FIG. 5.

Figure 6:
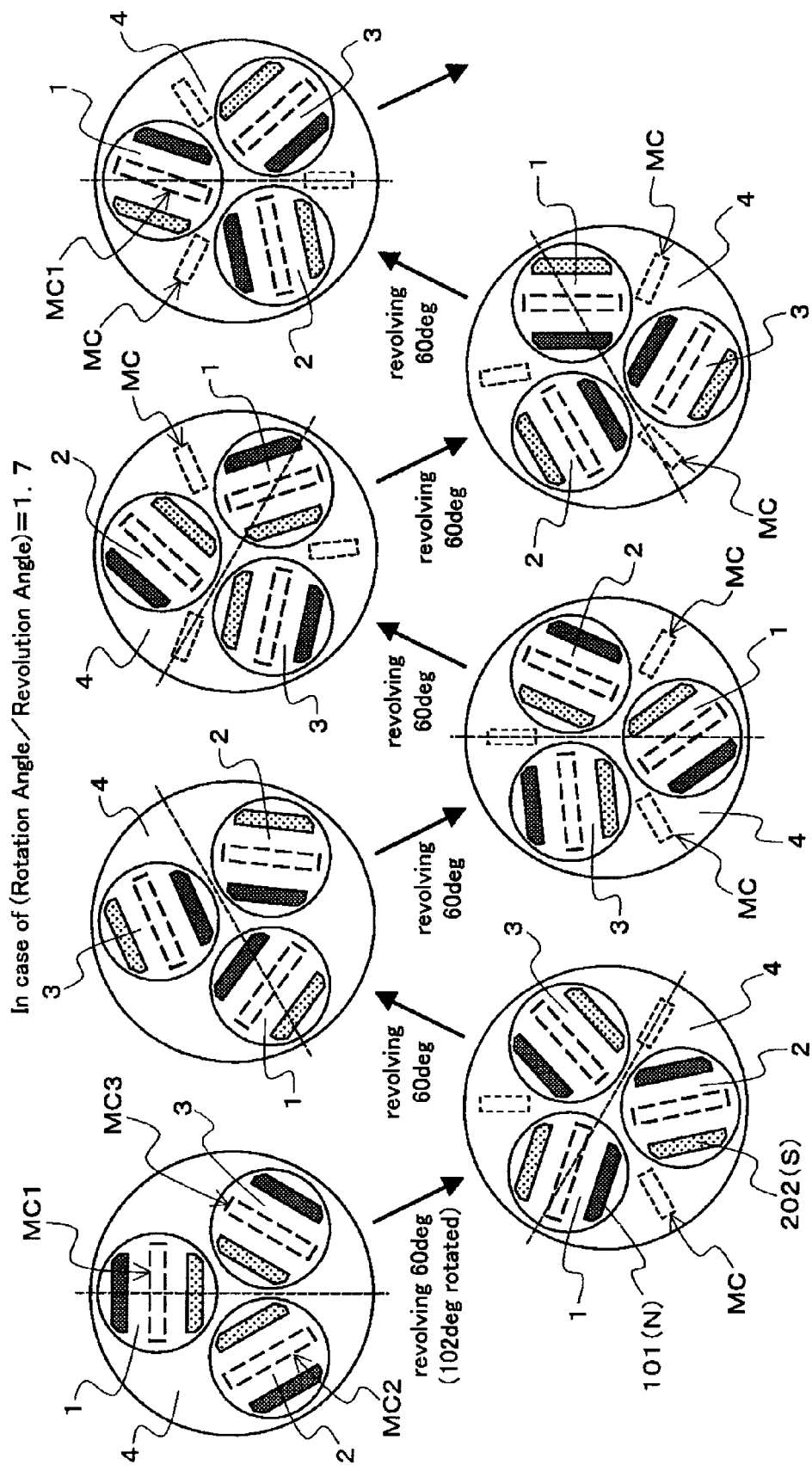
FIG. 6 is a schematic diagram for explaining a second principle of a method for applying magnetic fields in the sputtering system according to the present invention, and a figure showing an example of operation of magnets in the case where the ratio between rotation angle and revolution angle is set to 1.7:1.
Figure 7:
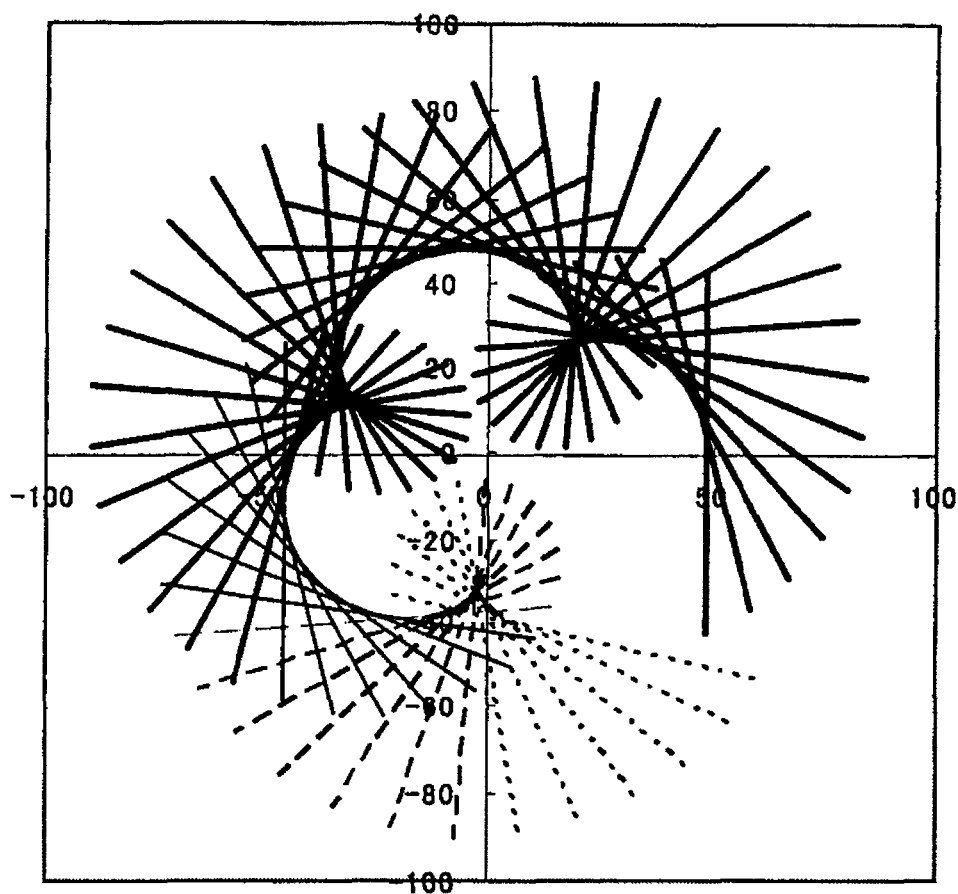
FIG. 7 is a schematic diagram for explaining the second principle of the method for applying the magnetic fields in the sputtering system according to the present invention, and a figure showing an example of a change of the center of the magnetic field in case where the ratio between rotation angle and revolution angle is set to 1.7:1.
Figure 8:
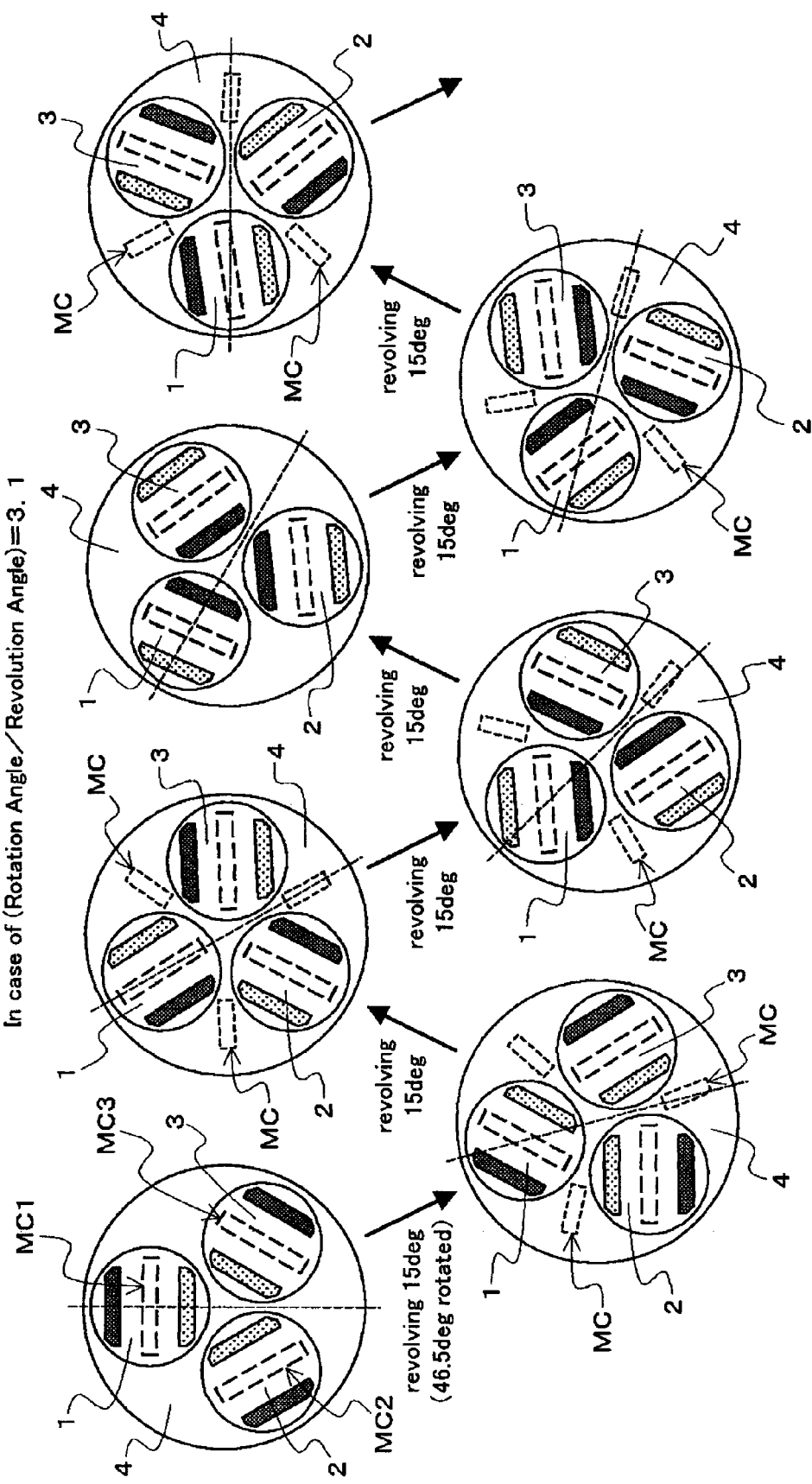
FIG. 8 is a schematic diagram for explaining the second principle of the method for applying the magnetic fields in the sputtering system according to the present invention, and a figure showing an example of operation of magnets in the case where the ratio between rotation angle and revolution angle is 3.1:1.
Figure 9:
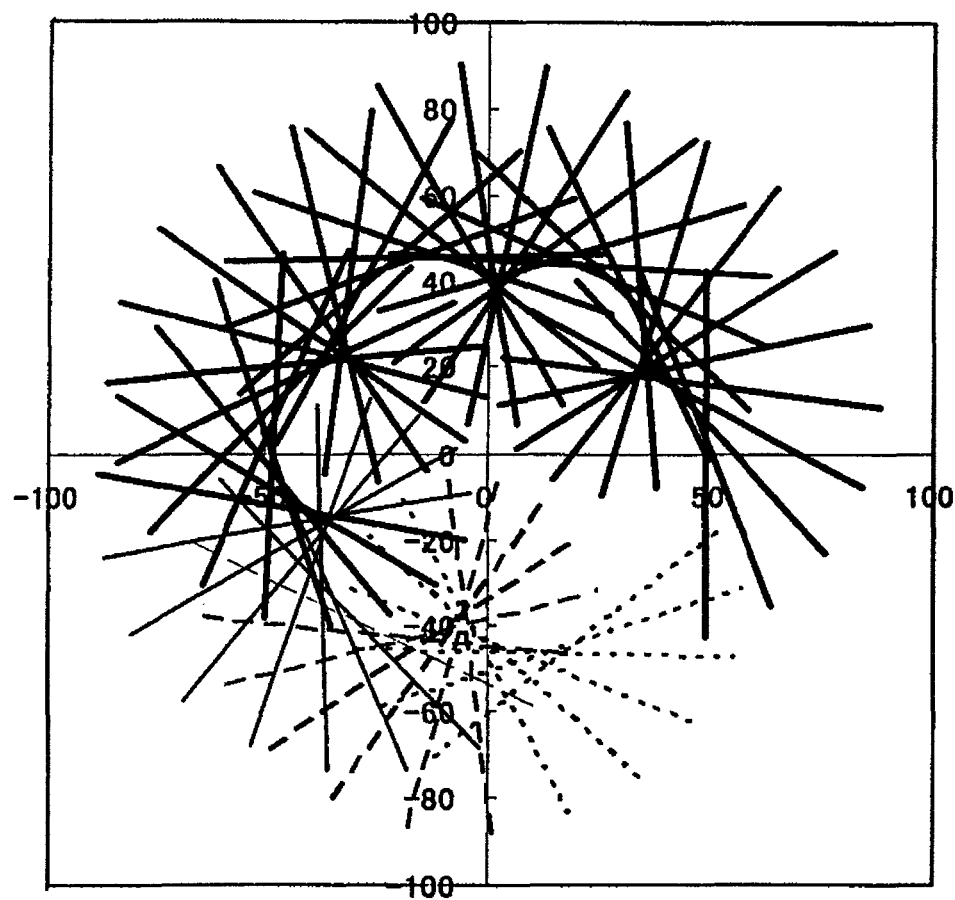
FIG. 9 is a schematic diagram for explaining the second principle of the method for applying the magnetic fields in the sputtering system according to the present invention, and a figure showing an example of a change of the center of the magnetic field in case where the ratio between rotation angle and revolution angle is set to 3.1:1.
Figure 10:
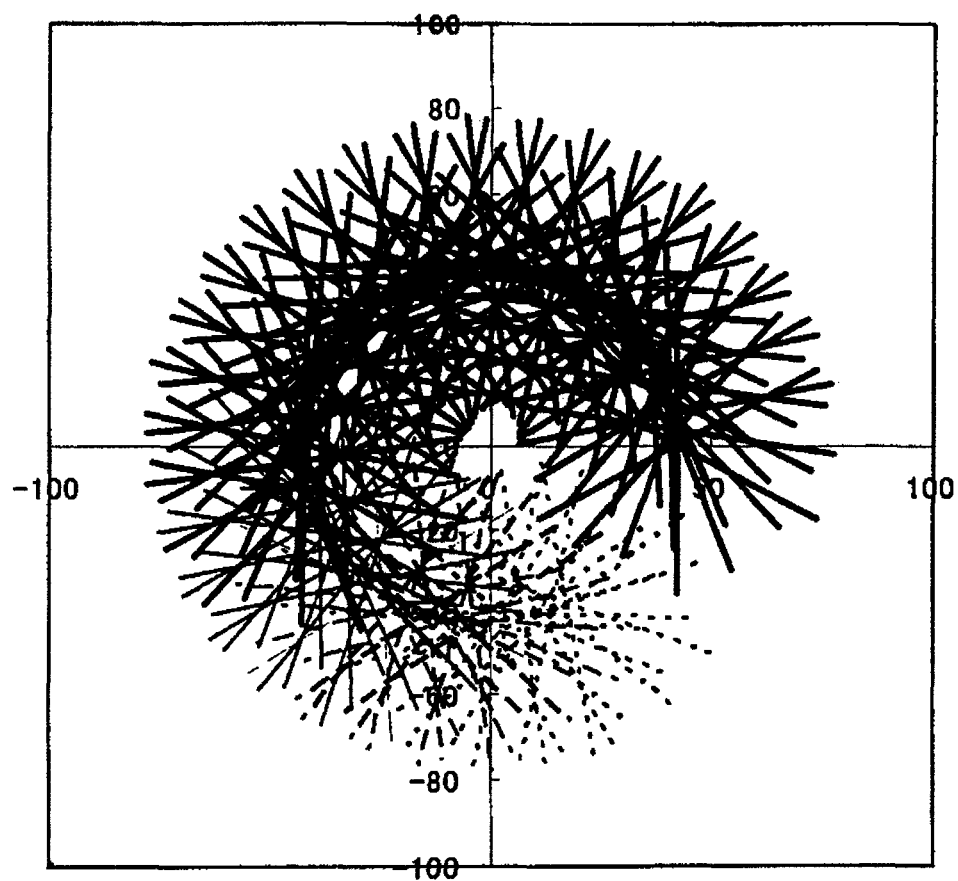
FIG. 10 is a schematic diagram for explaining the second principle of the method for applying the magnetic fields in the sputtering system according to the present invention, and a figure showing a case where the changes of the centers of the magnetic fields of the three magnets are synthesized when the ratio between rotation angle and revolution angle is set to 3.1:1.

FIG. 6 to FIG. 10 are schematic diagrams for explaining a second principle of a method for applying magnetic fields in the sputtering system according to the present invention. FIG. 6 is a figure showing an example of operation of magnets in the case where the ratio between rotation angle and revolution angle is set to 1.7:1. FIG. 7 is a figure showing an example of change of the center of the magnetic field in the case where the ratio between the rotation angle and the revolution angle is set to 1.7:1. FIG. 8 is a figure showing an example of operation of the magnets in the case where the ratio between rotation angle and revolution angle is set to 3.1:1. FIG. 9 is a figure showing an example of change of the center of the magnetic field in the case where the ratio between the rotation angle and the revolution angle is set to 3.1:1. FIG. 10 is a figure showing a case where the changes of the centers of the magnetic fields of three magnets are synthesized in the case where the ratio between rotation angle and revolution angle is set to 3.1:1.

In the sputtering system according to the present invention, for example, in the case where three magnets 1, 2 and 3 are rotated and revolved as shown in FIG. 2, and where the ratio between rotation angle and revolution angle per unit time is set to n:1 (where n is a positive integer), when the magnets are revolved one time (360 degrees), the distribution of the region (erosion region) on the surface of the target where atoms or molecules are liable to be discharged, is not changed before and after the revolution. That is, variation of the centers of the magnetic fields (erosion regions) MC1, MC2 and MC3 of the respective magnets 1; 2 and 3 are periodic, so that variation in the distribution of the region (erosion region) on the surface of the target where atoms or molecules are liable to be discharged becomes relatively monotonous. At this time, variation of the centers of the magnetic fields (erosion regions) MC1, MC2 and MC3 in the respective regions on the surface of the target when the magnets 1, 2 and 3 are revolved a plurality of times, are uniquely determined by the initial arrangement of the respective magnets 1, 2 and 3. As a result, it is difficult to say that the variation of the erosion region on the whole is uniformized. Thus, in the sputtering system according to the present invention, in order that variation of the centers of the magnetic fields (erosion regions) MC1, MC2 and MC3 in the respective regions on the surface of the target when the magnets 1, 2 and 3 are revolved a plurality of times, is made more complicated, it is preferred that when the ratio between rotation angle and revolution angle per unit time of the respective magnets 1, 2 and 3 is set to R:1, R is set to a value from 1 to 5 and is not set to a common divisor of 360.

As an example of such method, there is considered a case where R=1.7, that is, the ratio between rotation angle and revolution angle is set to 1.7:1. At this time, the respective magnets 1, 2 and 3 are rotated by 1.7×θ degrees while being revolved by θ degrees, and hence the respective magnets 1, 2 and 3 are changed, for example, in a manner as shown in FIG. 6, while being revolved one time (360 degrees). That is, since the respective magnets 1, 2 and 3 are rotated by 360×1.7=612 degrees while being revolved one time (360 degrees), when the respective magnets 1, 2 and 3 are revolved one time from the state shown in the upper left end of FIG. 6, the respective magnets 1, 2 and 3 are brought into the state shown in the upper right end of FIG. 6. Thus, the direction of the centers of the magnetic fields (erosion regions) MC1, MC2 and MC3 of the respective magnets 1, 2 and 3 is different before and after the respective magnets 1, 2 and 3 are revolved one time. Therefore, variation of the centers of the magnetic fields (erosion regions) in the respective regions on the surface of the target when the respective magnets 1, 2 and 3 are revolved a plurality of times, is made more complicated, and hence it can be said that variation of the erosion region on the whole is more uniformized as compared with the case where the ratio between rotation speed and revolution speed is set to n:1 (n is a positive integer). Further, in the case where the ratio between rotation angle and revolution angle is set to 1.7:1, for example, the path of the center of magnetic field (erosion region) of one magnet is obtained as shown in FIG. 7, from the relation as shown in FIG. 4 and Formula 1.

Similarly, at this time, there is considered a case where R=3.1, that is, the ratio between rotation angle and revolution angle per unit time is set to 3.1:1. At this time, the respective magnets 1, 2 and 3 are rotated by 3.1×θ degrees while being revolved by θ degrees, and hence the respective magnets 1, 2 and 3 are changed, for example, in a manner as shown in FIG. 8, while being revolved by 90 degrees. Further, in the case where the ratio between rotation angle and revolution angle is set to 3.1:1, for example, the path of the center of magnetic field (erosion region) of one magnet is obtained as shown in FIG. 9, from the relation as shown in FIG. 4 and Formula 1. Since the path shown in FIG. 9 is a path for one magnet, when the paths as shown in FIG. 9 are synthesized in order to see the path in the case of three magnets as shown in FIG. 1, the path (distribution) as shown in FIG. 10 is obtained.

Figure 11:
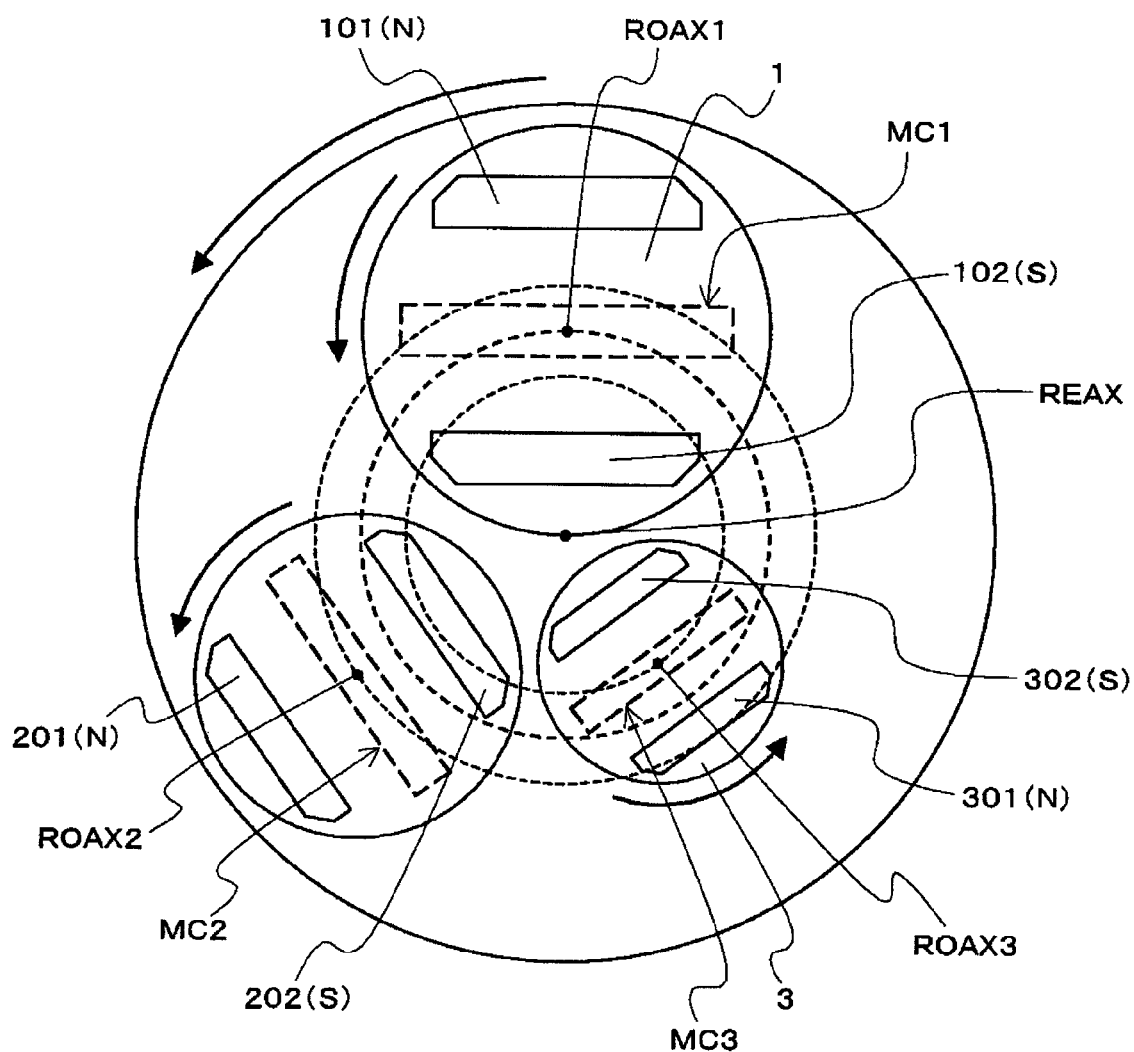
FIG. 11 is a schematic diagram for explaining a third principle of a method for applying magnetic fields in the sputtering system according to the present invention, and a figure showing an example of arrangement of magnets.
Figure 12:
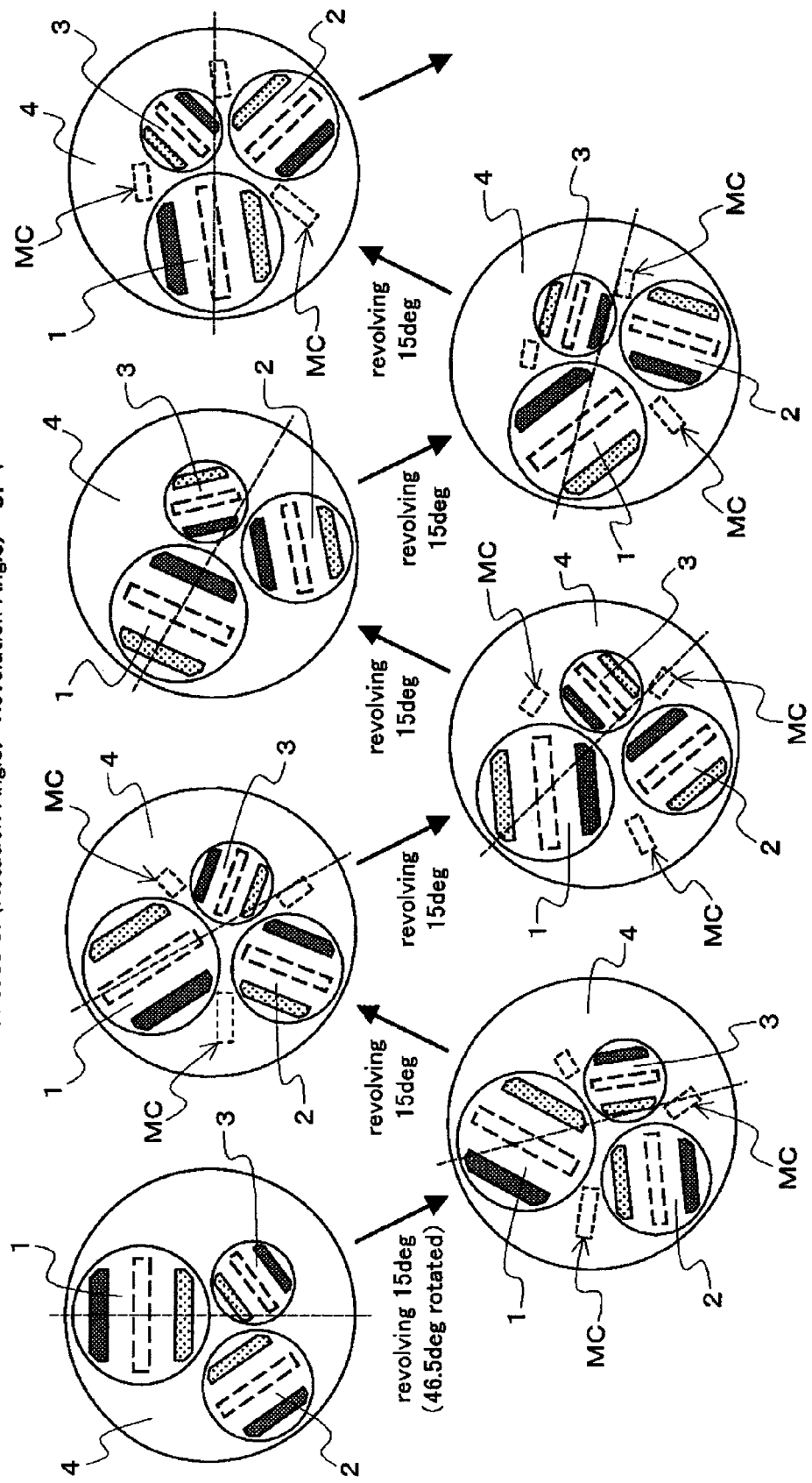
FIG. 12 is a schematic diagram for explaining the third principle of the method for applying the magnetic fields in the sputtering system according to the present invention, and a figure showing an example of operation of the magnets in the case where the ratio between rotation angle and revolution angle is set to 3.1:1.
Figure 13:
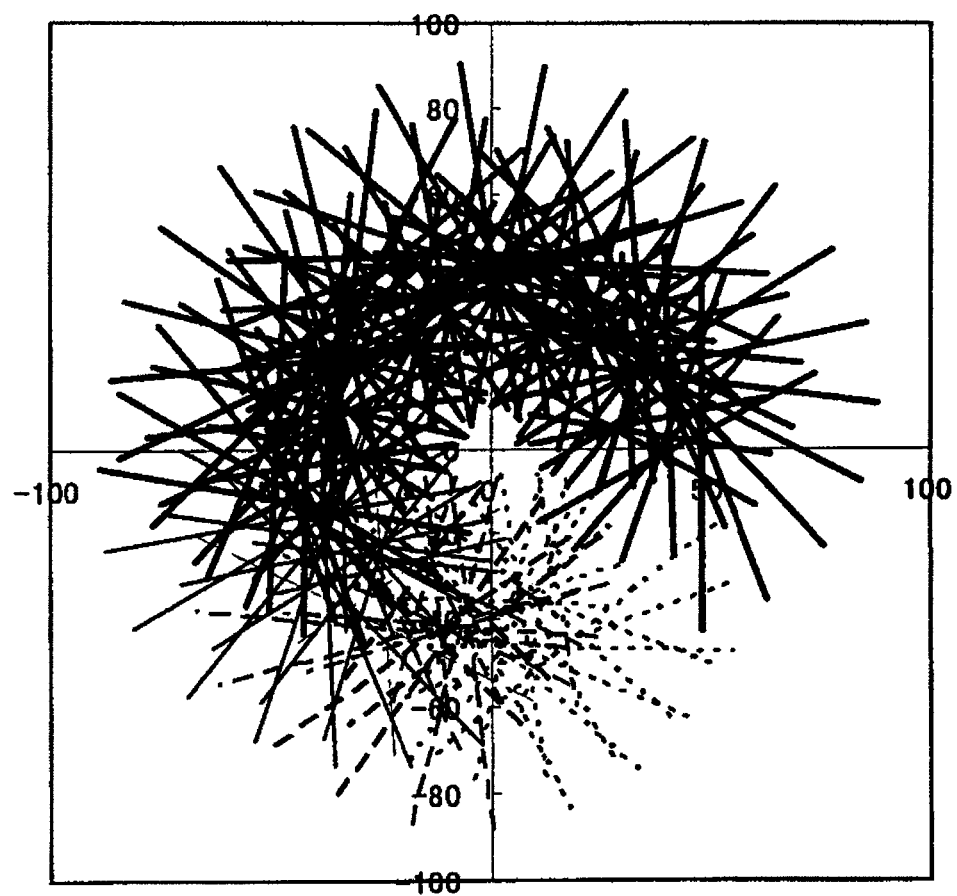
FIG. 13 is a schematic diagram for explaining the third principle of the method for applying the magnetic fields in the sputtering system according to the present invention, and a figure showing an example of a change of the center of the magnetic field in case where the ratio between rotation angle and revolution angle is set to 3.1:1.
Figure 14:
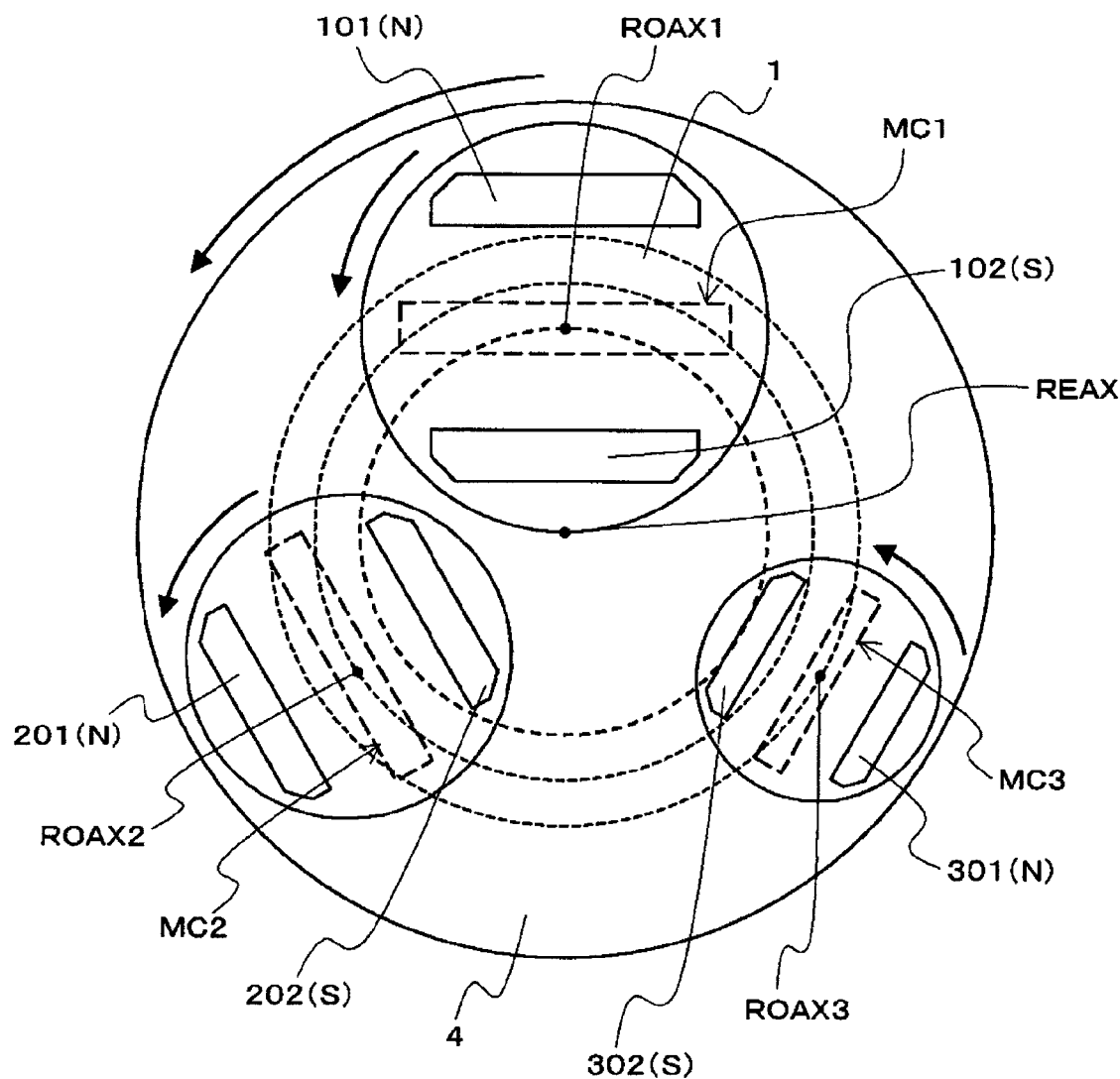
FIG. 14 is a schematic diagram for explaining the third principle of the method for applying the magnetic fields in the sputtering system according to the present invention, and a figure showing a modification of arrangement of the magnets.

FIG. 11 to FIG. 14 are schematic diagrams for explaining a third principle of a method for applying magnetic fields in the sputtering system according to the present invention. FIG. 11 is a figure showing an example of an arrangement of magnets. FIG. 12 is a figure showing an example of operation of the magnets in the case where the ratio between rotation angle and revolution angle is set to 3.1:1. FIG. 13 is a figure showing an example of variation of the centers of the magnetic fields in the case where the ratio between rotation angle and revolution angle is set to 3.1:1. FIG. 14 is a figure showing a modification of the arrangement of the magnets.

As a preferred example of a method for applying magnetic fields in the sputtering system according to the present invention, in the second principle, it is described that R is set to 1 to 5 and is not set to a common divisor of 360, when the ratio between rotation angle and revolution angle per unit time is set to R:1. However, when the second principle is applied to the arrangement of the magnets 1, 2 and 3 as shown in FIG. 1, the distances from the center of revolution to the centers of rotation of the respective magnets 1, 2 and 3 are equal with each other. Therefore, when the paths of the centers of the magnetic fields MC1, MC2 and MC3 independently generated by the respective magnets 1, 2 and 3 are synthesized, the density of the path is increased on the paths of the centers of rotation of the respective magnets 1, 2 and 3, as shown in FIG. 10, and hence it is considered that the wearing of the target in the vicinity of the paths of the centers of rotation of the respective magnets is increased. Thus, in the sputtering system according to the present invention, it is preferred that under the application of the first principle and the second principle, the respective magnets are arranged so that the distances from the center of revolution REAX to the centers of rotation ROAX1, ROAX2 and ROAX3 of the respective magnets 1, 2 and 3 are different from each other, as shown in FIG. 11.

There is considered a case where the magnets 1, 2 and 3 arranged as shown in FIG. 11 are revolved when the ratio between rotation angle and revolution angle per unit time is set to 3.1:1. At this time, the respective magnets 1, 2 and 3 are rotated by 3.1×θ degrees while being revolved by θ degrees, and hence the respective magnets 1, 2 and 3 are changed, for example, in a manner as shown in FIG. 12, while being revolved by 90 degrees. Further, in the case where the ratio between rotation angle and revolution angle is set to 3.1:1, from the relation shown in FIG. 4 and Formula 1, and in consideration of the distances from the center of revolution to the centers of rotation of the respective magnets 1, 2 and 3, paths of the centers of the magnetic fields (erosion regions) MC1, MC2 and MC3 of the respective magnets 1, 2 and 3 are obtained to be synthesized as shown in FIG. 13. At this time, in the case where the distance between the center of rotation ROAX1 of the largest magnet 1 and the center of revolution REAX in the arrangement of the magnets as shown in FIG. 11 is set to be equal to the distance between the center of rotation of the each magnet and the center of revolution in the arrangement of the magnets as shown in FIG. 1, where in the arrangement of the magnets as shown in FIG. 11, the distance between the center of rotation ROAX2 of the second largest magnet 2 and the center of revolution REAX is set to be larger by Δr than the distance between the center of rotation ROAX1 of the largest magnet 1 and the center of revolution REAX, and where in the arrangement of the magnets as shown in FIG. 11, the distance between the center of rotation ROAX3 of the smallest magnet 3 and the center of revolution REAX is set to be smaller by Δr than the distance between the center of rotation ROAX1 of the largest magnet 1 and the center of revolution REAX, it can be seen from the comparison between the distribution of the paths shown in FIG. 13 and the distribution of the paths shown in FIG. 10, that the width of the high density region (where the distribution of the paths is dense) is more increased in FIG. 13 as compared with that in FIG. 10. Thus, it is considered that, by changing the distances between the centers of rotation of the respective magnets and the center of revolution thereof from each other, the change of the erosion region on the whole can be further uniformized, and the homogenization of the thin film formed on the substrate and the uniformization of the thickness of the thin film can be effected.

Further, in FIG. 11, there is exemplified the arrangement in which when the distance between the center of rotation of the largest magnet and the center of revolution is taken as a reference, the distance between the center of rotation of the second largest magnet and the center of revolution is set to be larger by Δr than the distance between the center of rotation of the largest magnet and the center of revolution, and in which the distance between the center of rotation of the smallest magnet and the center of revolution is set to be smaller by Δr than the distance between the center of rotation of the largest magnet and the center of revolution, but the present invention is not limited to this arrangement. For example, as shown in FIG. 14, it may also be arranged such that, when the distance between the center of rotation ROAX1 of the largest magnet 1 and the center of revolution REAX is taken as a reference, the distance between the center of rotation ROAX2 of the second largest magnet 2 and the center of revolution REAX is set to be larger by Δr than the distance between the center of rotation ROAX1 of the largest magnet 1 and the center of revolution REAX, and that the distance between the center of rotation ROAX3 of the smallest magnet 3 and the center of revolution REAX is set to be further larger by Δr than the distance between the center of rotation ROAX2 of the second largest magnet 2 and the center of revolution REAX. Further, the arrangement is not limited to those as shown in FIG. 11 and FIG. 14, any arrangement may be used, provided that the distances between the centers of rotation of the respective magnets 1, 2 and 3 and the center of revolution are different from each other, and that the respective magnets can be rotated without being brought into contact with the other magnet.

Figure 15:
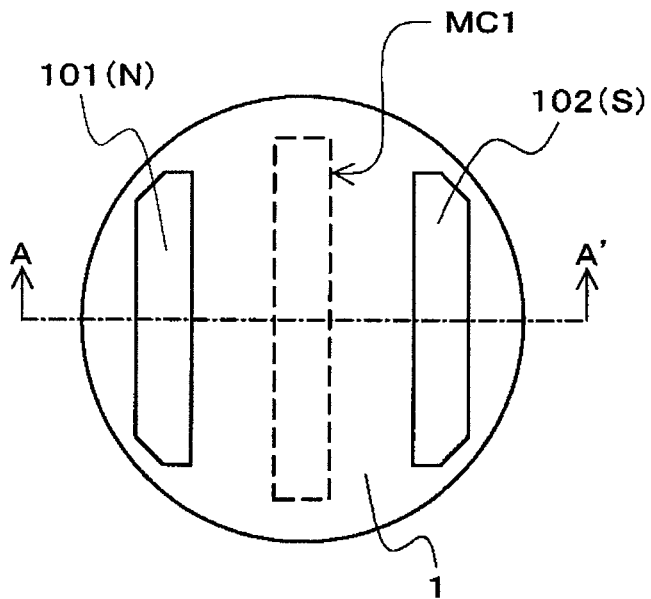
FIG. 15 is a schematic diagram for explaining a constitution example of a magnet for applying a magnetic field in the sputtering system according to the present invention, and a plan view showing a constitution example of the magnet for applying an open loop magnetic field.
Figure 16:
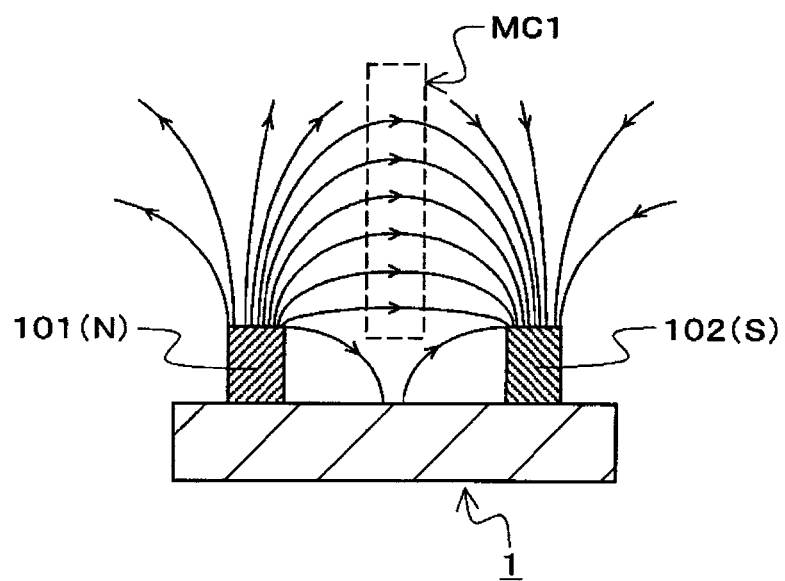
FIG. 16 is a schematic diagram for explaining the constitution example of the magnet for applying the magnetic field in the sputtering system according to the present invention, and a sectional view along the line A-A' in FIG. 15.
Figure 17:
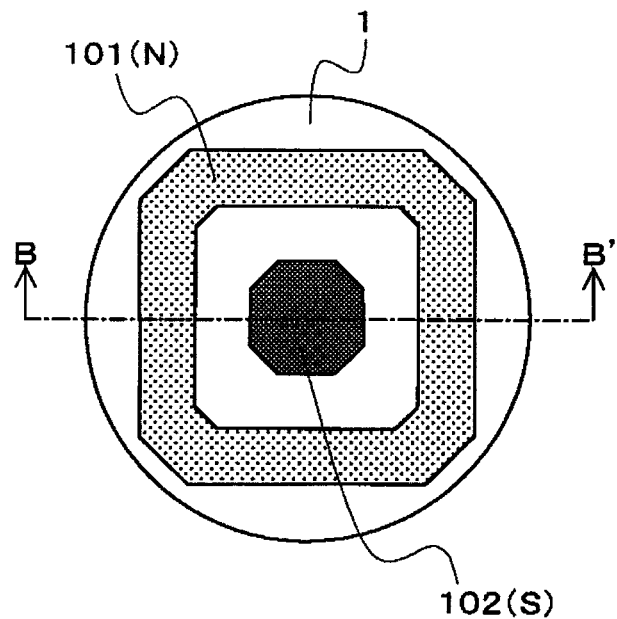
FIG. 17 is a schematic diagram for explaining a constitution example of a magnet for applying a magnetic field in the sputtering system according to the present invention, and a plan view showing a constitution example of the magnets for applying a closed loop magnetic field.
Figure 18:
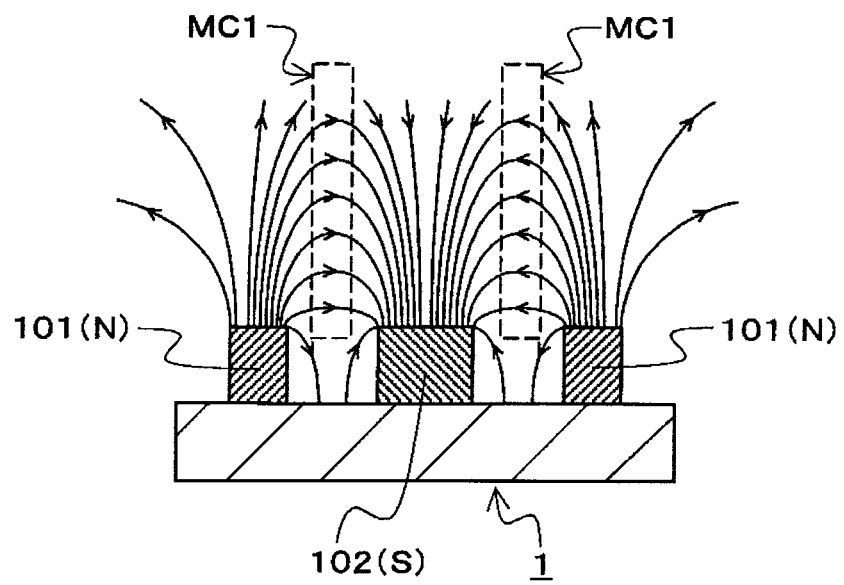
FIG. 18 is a schematic diagram for explaining the constitution example of the magnet for applying the magnetic field in the sputtering system according to the present invention, and a sectional view along the line B-B' in FIG. 17.

FIG. 15 to FIG. 18 are schematic diagrams for explaining a constitution example of a magnet for applying a magnetic field in the sputtering system according to the present invention. FIG. 15 is a plan view showing a constitution example of a magnet for applying an open loop magnetic field. FIG. 16 is a sectional view along the line A-A' in FIG. 15. FIG. 17 is a plan view showing a constitution example of a magnet for applying a closed loop magnetic field. FIG. 18 is a sectional view along the line B-BT in FIG. 17.

In the sputtering system according to the present invention, the magnet 1 for applying a magnetic field may be, for example as shown in FIG. 15 and FIG. 16, a magnet constituted by providing an N pole 101 and an S pole 102 which have a rod-like or plate-like form and face each other on the right and left, so as to apply an open loop magnetic field, or may be, as shown in FIG. 17 and FIG. 18, a magnet constituted by providing an S pole 102 in the inside of an annular N pole 101, so as to apply a closed loop magnetic field. In the case of the magnet for applying the closed loop magnetic field as shown in FIG. 17 and FIG. 18, by alternately arranging a plurality of magnets constituted by providing an S pole in the inside of an annular N pole and a plurality of magnets constituted by providing an N pole in the inside of an annular S pole, an open loop magnetic field can be generated between the adjacent magnets, in addition to the closed loop magnetic field independently generated by the each magnet. Further, in the case of the magnet for applying the closed loop magnetic field as shown in FIG. 17 and FIG. 18, the shape of the annular magnet and the inside magnet may be circular or non-circular.

Further, for explaining the first principle to the third principle, there is exemplified the case where three magnets 1, 2 and 3 are correspondingly revolved and rotated as shown in FIG. 1 or FIG. 11, but the present invention is not limited to the case. Two magnets may be correspondingly revolved and rotated, or four or more magnets may also be correspondingly revolved and rotated.

Further, for explaining the first principle to the third principle, there is exemplified the case where three magnets 1, 2 and 3 are rotated in the same direction as shown in FIG. 1 or FIG. 11, but the present invention is not limited to the case. A magnet rotated clockwise and a magnet rotated counterclockwise may be mixedly provided.

In the following, there will be explained a constitution example of the sputtering system to which the first principle to the third principle are applied.

Example

Figure 19:
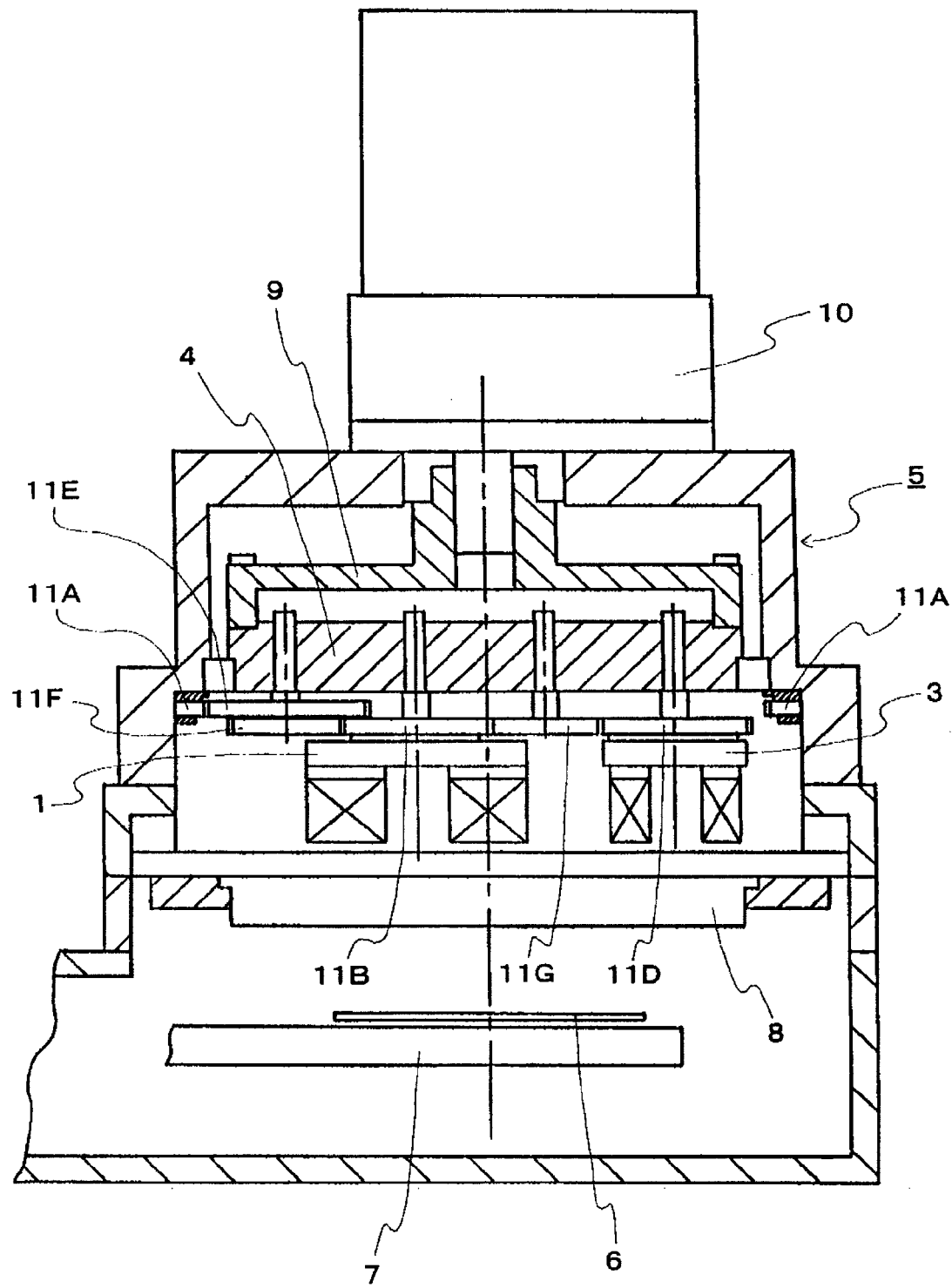
FIG. 19 is a schematic diagram showing a schematic constitution of a sputtering system of an example according to the present invention, and a sectional view showing an example of an overall constitution of the apparatus.
Figure 20:
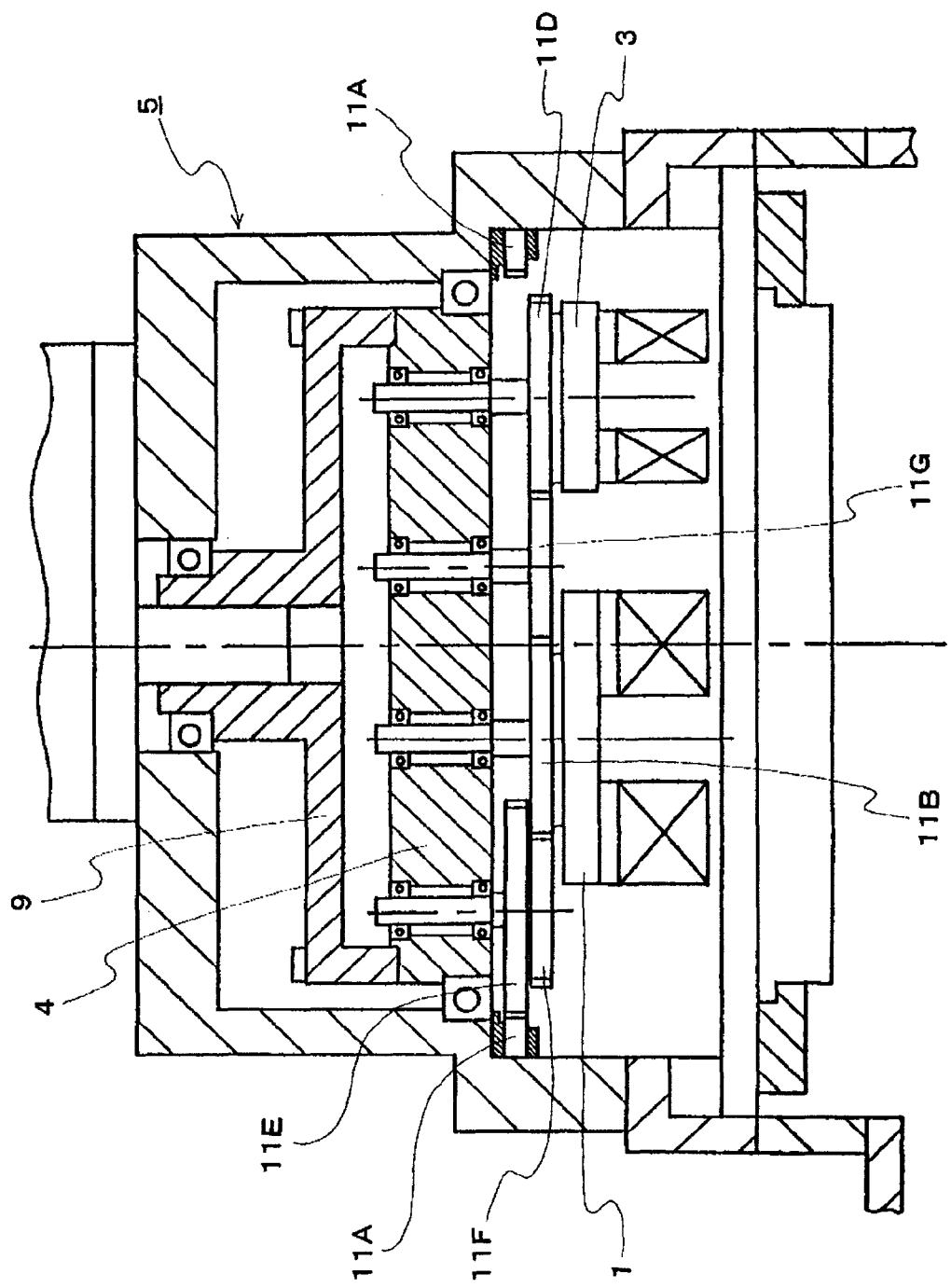
FIG. 20 is a schematic diagram showing the schematic constitution of the sputtering system of the example according to the present invention, and an enlarged view showing the vicinity of the magnetic field applying means in FIG. 19.
Figure 21:
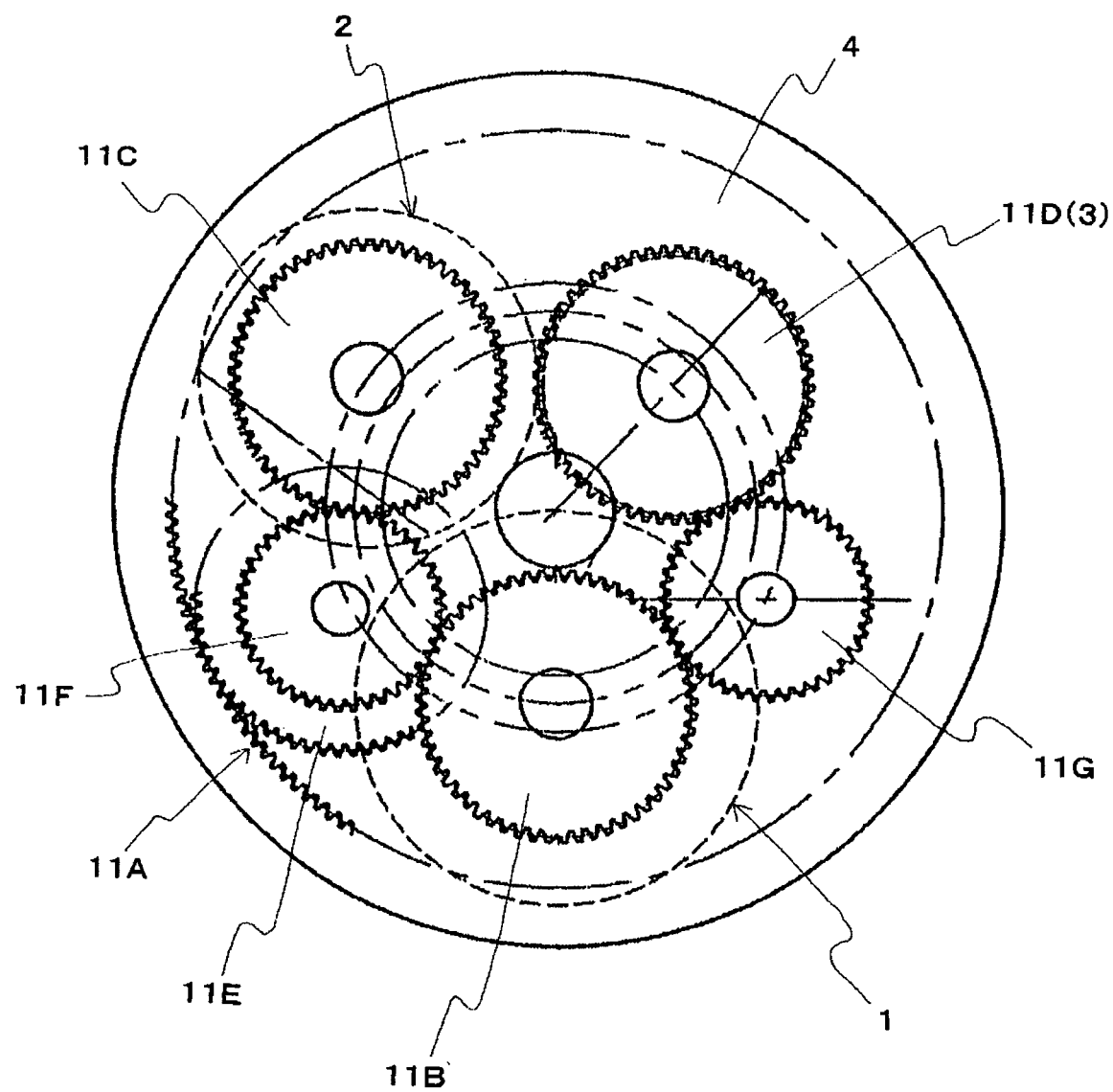
FIG. 21 is a schematic diagram showing the schematic constitution of the sputtering system of the example according to the present invention, and a figure showing a constitution example of magnet rotating means of the magnetic field applying means.
Figure 22:
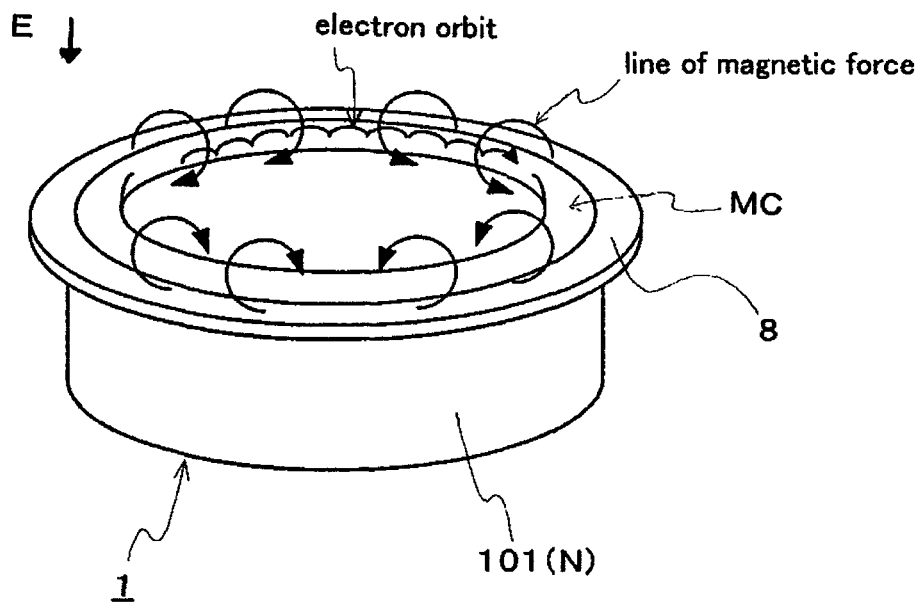
FIG. 22 is a schematic diagram showing an operation principle of a sputtering system using a conventional planar magnetron cathode electrode.
Figure 23:
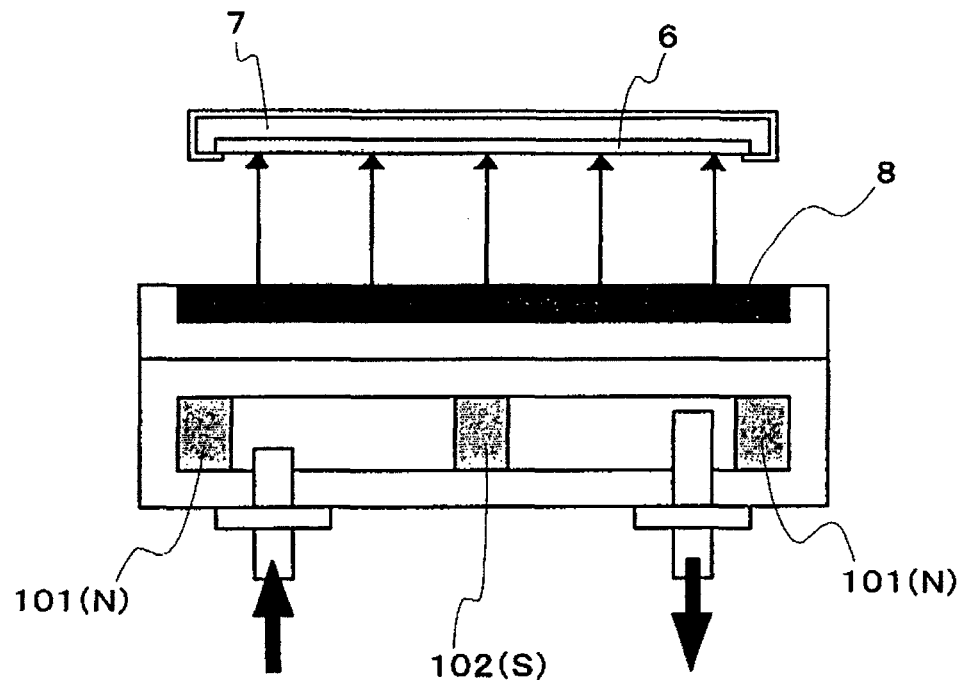
FIG. 23 is a schematic diagram showing the operation principle of the sputtering system using the conventional planar magnetron cathode electrode.
Figure 24:
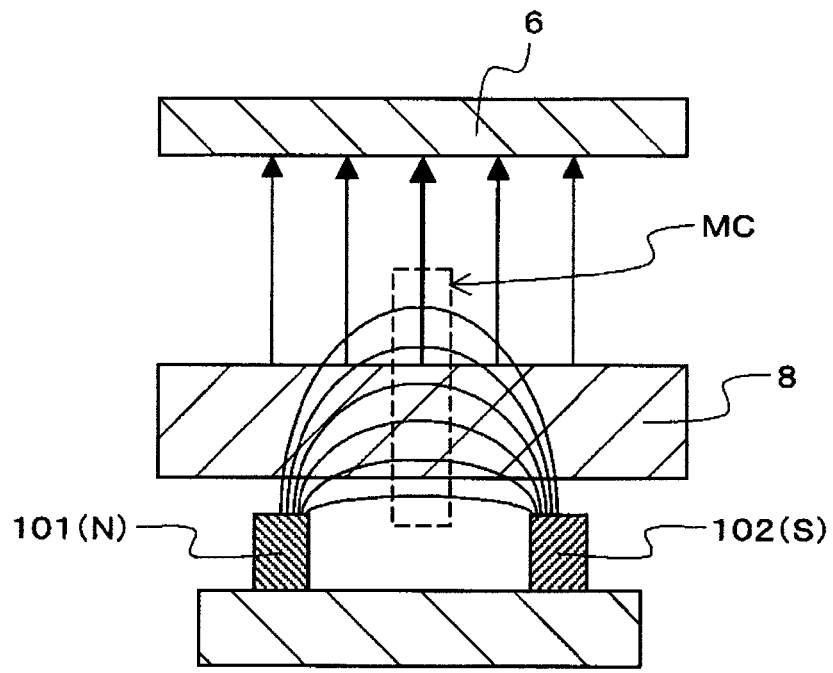
FIG. 24 is a schematic diagram for explaining a method for forming a thin film by the sputtering system using the conventional planar magnetron cathode electrode.
Figure 25:
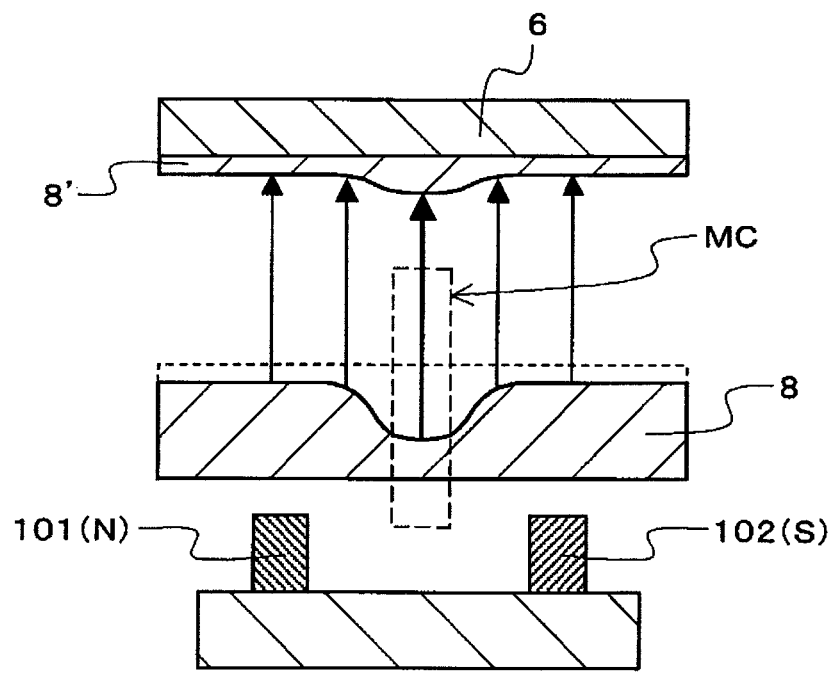
FIG. 25 is a schematic diagram for explaining a problem in the sputtering system using the conventional planar magnetron cathode electrode.

FIG. 19 to FIG. 21 are schematic diagrams showing a schematic constitution of a sputtering system of an example according to the present invention. FIG. 19 is a sectional view showing an example of an overall constitution of the apparatus. FIG. 20 is an enlarged view of the vicinity of the magnetic field applying means in FIG. 19. FIG. 21 is a figure showing a constitution example of magnet rotating means of the magnetic field applying means.

As shown in FIG. 19 and FIG. 20, a sputtering system of the present example is a system including, in a vacuum container 5 whose inside can be evacuated to a vacuum state, a substrate holder 7 adapted to hold a substrate 6 on which a thin film is formed, a target 8 provided at a position facing the thin film forming surface of the substrate 6 held by the substrate holder 7, electric field applying means (not shown) adapted to apply an electric field between the substrate 6 held by the substrate holder 7 and the target 8, and magnetic field applying means adapted to apply magnetic fields which intersect the electric field on the target 8. Note that although not shown in FIG. 19 and FIG. 20, the sputtering system also includes evacuating means adapted to evacuate the inside of the vacuum container 5 to a vacuum state, gas introducing means adapted to introduce a discharge gas into the vacuum container 5, and target cooling means adapted to cool the target 8. Further, the substrate holder 7 may also function as a heater to heat the substrate 6.

Further, the magnetic field applying means includes, as shown in FIG. 19 and FIG. 20, a plurality of magnets, magnet supporting means 4 adapted to respectively support the respective magnets in a rotatable state, magnet revolving means 9 adapted to rotate the magnet supporting means 4 about a predetermined axis of rotation, and to revolve the respective magnets about the axis of rotation, and magnet rotating means adapted to rotate the respective magnets in correspondence with the rotation of the magnet supporting means 4. At this time, for example, as shown in FIG. 11, the magnets 1, 2 and 3 each of which has a difference size and a different distance from the center of revolution to the center of rotation are supported by the magnet supporting means 4. Further, the magnet revolving means 9 is connected to a drive motor 10.

Further, at this time, the magnet rotating means includes, for example, as shown in FIG. 20 and FIG. 21, an internal gear 11A provide by being fixed along the vicinity of the outer peripheral part of the magnet supporting means 4, magnet rotation gears 11B, 11C and 11D respectively provided by being fixed to the magnets 1, 2 and 3, an idle gear 11E in mesh with the internal gear 11A, an idle gear 11F in mesh with the magnet rotation gears 11B and 11C, and an idle gear 11G in mesh with the two magnet rotation gears 11B and 11D. At this time, the idle gear 11E in mesh with the internal gear 11A is connected to the idle gear 11F which is adapted to overlap the idle gear 11E and in mesh with the magnet rotation gears 11B and 11C.

Further, at this time, when a gear ratio between the internal gear 11A and the idle gear 11F which is connected with the idle gear 11E in mesh with the internal gear 11A and rotates the magnet rotation gears 11B and 11C is set to 1:R, the R can be set to any value. However, as explained in relation to the second principle, it is preferred that R is set to a value which is not smaller than 1 and not larger than 5, and is not a common divisor of 360.

In the sputtering system constituted as described above, for example, when the drive motor 10 is rotated to make the magnet revolving means 9 rotated, the magnet supporting means 4 is rotated so that the respective magnets 1, 2 and 3 supported by the magnet supporting means 4 is revolved.

Further, at this time, when the magnet supporting means 4 is rotated, the idle gear 11E in mesh with the internal gear 11A, and the idle gear 11F connected with the idle gear 11E are rotated, so that the gear 11B which is in mesh with the idle gear 11F and fixed to the largest magnet 1, and the gear 11C which is in mesh with the idle gear 11F and fixed to the second largest magnet 2 are rotated. Further, as shown in FIG. 21, the other idle gear 11G is in mesh with the gear 11B fixed to the largest magnet 1, and the other idle gear 11G is in mesh with the gear 11D fixed to the smallest magnet 3. Thus, when the gear 11B fixed to the largest magnet 1 is rotated, the gear 11G fixed to the smallest magnet 3 is also rotated. As a result, the rotation of the magnet supporting means 4 causes the respective magnets 1, 2 and 3 to be correspondingly revolved and rotated, and hence, as explained in accordance with the first principle to the third principle, the centers of the magnetic fields (erosion regions) E1, E2 and E3 on the surface of the target are changed in a complicated manner. Thereby, the erosion regions on the whole can be further uniformized, and the homogenization of the thin film formed on the substrate and the uniformization of the thickness of the thin film can be effected.

Note that since the operation of the system in the case of forming a thin film by using the sputtering system of the present example is different from the operation of the conventional sputtering system only in the operation of the magnetic field applying means, the other operations are the same as those of the conventional sputtering system, and hence detailed explanation thereof is omitted.

As explained above, according to the sputtering system of the present example, it is possible to change the centers of the magnetic fields (erosion regions) in a complicated manner by correspondingly revolving and rotating the respective magnets by means of the magnet rotating means, whereby the change of the erosion regions on the surface of the target on the whole can be uniformized, and the homogenization of the thin film formed on the substrate and the uniformization of the thickness of the thin film can be effected.

Further, it is possible to easily change the ratio between rotation angle and revolution angle per unit time of each magnet by changing the gear ratio of the internal gear 11A of the magnet rotating means to the idle gear 11 E, and the gear ratio of the idle gear 11F to the magnet rotation gears 11B and 11C, whereby the sputtering system can be easily manufactured, which is capable of changing the centers of the magnetic fields (erosion regions) in a complicated manner and facilitating the homogenization of the thin film formed on the substrate and the uniformization of the thickness of the thin film.

As described above, the present invention is specifically explained on the basis of the example, but the present invention is not limited to the example. It is obvious that various modifications are possible within the spirit and scope of the present invention.

For example, in the above described example, there is exemplified the sputtering system adapted to revolve and rotate three magnets, but the present invention is not limited to this. The sputtering system according to the present invention may be adapted such that two magnets are revolved and rotated, or four or more magnets are revolved and rotated. Further, in the above described example, there is exemplified the case where the respective magnets are rotated in the same direction, but the present invention is not limited to this. The sputtering system according to the present invention may be adapted such that the respective magnets are rotated in any of the clockwise or counter clockwise directions.

Further, in the above described example, the respective magnets 1, 2 and 3 are rotated by using the internal gear 11A, the magnet rotation gears 11B, 11C and 11D, and the idle gears 11E, 11F and 11G as the magnet rotating means, but the present invention is not limited to this. The respective magnets 1, 2 and 3 may also be rotated by the other method.

The invention claimed is:

1. A sputtering system which includes a substrate holder adapted to hold a substrate on which a thin film is formed, in a vacuum container whose inside is evacuated to a vacuum state, a target provided at a position facing a thin film forming surface of the substrate held by the substrate holder, applying an electric field between the substrate held by the substrate holder and the target, and magnetic field applying means adapted to apply a magnetic field intersecting the electric field on the target, which generates a plasma on the target by introducing a discharge gas in the vacuum container evacuated to the vacuum state, to generate atoms or molecules from the target, and which makes the generated atoms or molecules deposited on the substrate held by the substrate holder to form the thin film, the sputtering system including:

the magnetic field applying means comprising: three or more magnets adapted to independently generate a magnetic field, respectively; magnet revolving means adapted to revolve each magnet of the three or more magnets, respectively about a central axis of revolution; and magnet rotating means adapted to rotate each magnet of the three or more magnets, respectively about a central axis of rotation, in linkage with the magnet revolving means, and an N pole and an S pole of each magnet of the three or more magnets are arranged in a manner that a magnetic field is generated by an interaction of one of the N pole and the S pole of each of the magnets with the other pole of an adjacent one of the magnets, and the generated magnetic field is changed while each of the magnets is revolved and rotated, wherein the three or more magnets are maintained equidistant from the central axis of revolution and are disposed so that distances from the central axis of revolution to the central axis of rotation of each one of the three or more magnets are maintained equal throughout the rotation about the central axis of revolution and the central axis of revolution is maintained parallel to the central axis of rotation of each one of the three or more magnets, and wherein the three or more magnets are disposed at equal distances from a rear side of the target.

2. The sputtering system according to claim 1, wherein the magnet rotating means rotates the respective magnets at a speed which prevents a rotation angle per unit time of the respective magnets from becoming an integer multiple of a revolution angle per unit time of the respective magnets.

* * * * *